(12) United States Patent
Yamamoto

(10) Patent No.: US 11,621,647 B2
(45) Date of Patent: Apr. 4, 2023

(54) SEMICONDUCTOR DEVICE

(71) Applicant: FUJI ELECTRIC CO., LTD., Kanagawa (JP)

(72) Inventor: Sayaka Yamamoto, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 156 days.

(21) Appl. No.: 17/003,927

(22) Filed: Aug. 26, 2020

(65) Prior Publication Data

US 2021/0111636 A1   Apr. 15, 2021

(30) Foreign Application Priority Data

Oct. 11, 2019  (JP) .............................. JP2019-187831

(51) Int. Cl.
```
H02M 7/00      (2006.01)
H01L 23/50     (2006.01)
H02M 7/487     (2007.01)
H01L 23/538    (2006.01)
H02M 7/537     (2006.01)
H01L 33/14     (2010.01)
```

(52) U.S. Cl.
CPC ............ H02M 7/003 (2013.01); H01L 23/50 (2013.01); H01L 23/5386 (2013.01); H01L 33/14 (2013.01); H02M 7/487 (2013.01); H02M 7/537 (2013.01)

(58) Field of Classification Search
CPC ...... H02M 7/003; H02M 7/487; H02M 7/537; H01L 23/50; H01L 23/5386; H01L 33/14; H01L 2224/48227; H01L 23/49811; H01L 23/5385; H01L 25/072; H01L 23/481
See application file for complete search history.

(56) References Cited

U.S. PATENT DOCUMENTS

2009/0130522 A1*  5/2009  Akikusa ............ H01M 8/04201
                                                     429/425
2014/0218991 A1*  8/2014  Chen .................... H01L 23/3735
                                                     363/131
(Continued)

FOREIGN PATENT DOCUMENTS

WO    2014122877 A1    8/2014
WO    2014192118 A1   12/2014
WO    2019202866 A1   10/2019

*Primary Examiner* — S M Sohel Imtiaz

(57) ABSTRACT

A semiconductor device is provided, comprising a plurality of circuit portions, and a first connection portion and a second connection portion that are formed of planar conductive materials and connected to any of the circuit portions, wherein the first connection portion and the second connection portion are arranged with respective main surfaces facing each other, the first connection portion and the second connection portion each comprising a circuit connection end connected to the circuit portions, a path restriction portion for restricting a current path in the main surface, directions of currents flowing through the current paths between the path restriction portions and the circuit connection ends are different in the first connection portion and the second connection portion. Directions of currents flowing through the current paths between the path restriction portions and the circuit connection ends are preferably different in the first connection portion and the second connection portion.

15 Claims, 18 Drawing Sheets

(56) References Cited

U.S. PATENT DOCUMENTS

| | | | |
|---|---|---|---|
| 2015/0023081 A1* | 1/2015 | Obiraki | H05K 5/0021 |
| | | | 257/77 |
| 2015/0235930 A1* | 8/2015 | Ewanchuk | H01L 21/4846 |
| | | | 363/131 |
| 2015/0243962 A1* | 8/2015 | Hiroki | H01M 4/0404 |
| | | | 429/233 |
| 2015/0270786 A1* | 9/2015 | Chen | H02M 7/537 |
| | | | 363/131 |
| 2016/0172995 A1* | 6/2016 | Obiraki | H01L 25/072 |
| | | | 361/728 |
| 2016/0192495 A1* | 6/2016 | Nakamura | H01L 23/5227 |
| | | | 361/783 |
| 2017/0170157 A1* | 6/2017 | Masuda | H01L 24/49 |
| 2017/0308206 A1* | 10/2017 | Yamai | G02F 1/13338 |
| 2019/0287948 A1* | 9/2019 | Oomori | H02M 1/34 |
| 2020/0227345 A1 | 7/2020 | Chen | |
| 2020/0266727 A1* | 8/2020 | Tsuchimochi | H02M 7/493 |

* cited by examiner

SEMICONDUCTOR DEVICE

The contents of the following Japanese patent application(s) are incorporated herein by reference:
No. 2019-187831 filed on Oct. 11, 2019.

BACKGROUND

1. Technical Field

The present invention relates to semiconductor devices.

2. Related Art

Conventionally, semiconductor devices having a plurality of semiconductor chips, in which current flows through each of the plurality of semiconductor chips are known (See Patent Documents 1 and 2, for example).
Patent Document 1: WO 2014/122877
Patent Document 2: WO 2014/192118

SUMMARY

In semiconductor devices, occurrence of oscillation and noise can be preferably suppressed in voltages and currents.

In a first aspect of the present invention, a semiconductor device is provided. The semiconductor device may include a plurality of circuit portions. The semiconductor device may include a first connection portion and a second connection portion that are formed of planar conductive materials and connected to any of the circuit portions. The first connection portion and the second connection portion may be arranged with respective main surfaces facing each other. The first connection portion and the second connection portion may each include a circuit connection end connected to the circuit portions and a path restriction portion for restricting a current path in the main surface. Directions of currents flowing through the current paths between the path restriction portions and the circuit connection ends may be different in the first connection portion and the second connection portion.

The directions of the currents flowing through the current paths between the path restriction portions and the circuit connection ends may be the opposite in the first connection portion and the second connection portion.

For each of the first connection portion and the second connection portion, the circuit connection ends and the path restriction portions may be arranged such that at least a portion of the current circulates around the path restriction portions. The directions of the currents circulating around the path restriction portions may be the opposite in the first connection portion and the second connection portion.

The first connection portion and the second connection portion may be arranged with respective main surfaces arranged in parallel.

The first connection portion and the second connection portion may include an overlapping region that overlaps in a direction orthogonal to the main surfaces. The path restriction portions of the first connection portion and the second connection portion may include one or more first slit extending in a first direction. In the overlapping region, the number of the first slits provided in the first connection portion and the number of the first slits provided in the second connection portion may be the same.

The path restriction portions of the first connection portion and the second connection portion may include one or more second slit extending in a second direction that is different from the first direction. In the overlapping region, the number of the second slits provided in the first connection portion and the number of the second slits provided in the second connection portion may be the same.

An upper end of the first connection portion and an upper end of the second connection portion may be arranged at a same height. In the overlapping region, the first slit provided in the first connection portion and the first slit provided in the second connection portion may be arranged at the same height.

The upper end of the first connection portion may be arranged at a position higher than the upper end of the second connection portion. In the overlapping region, the first slit provided in the first connection portion may be arranged at a position higher than the first slit provided in the second connection portion.

A width of the first slit in the first connection portion and a width of the first slit in the second connection portion may be different.

A thickness of the first connection portion may be larger than a thickness of the second connection portion. The width of the first slit in the first connection portion may be larger than the width of the first slit in the second connection portion.

A current flowing through the first connection portion may be larger than a current flowing through the second connection portion, and the width of the first slit in the first connection portion may be larger than the width of the first slit in the second connection portion.

The semiconductor device may further include a third connection portion formed of a planar conductive material and connected to any of the circuit portions. The first connection portion may be arranged to face a first main surface of the second connection portion. The third connection portion may be arranged to face the first main surface of the second connection portion. The third connection portion may include the circuit connection end and the path restriction portion. The directions of the currents flowing through the current paths between the path restriction portions and the circuit connection ends may be different in the third connection portion and the second connection portion.

The second connection portion may include an edge slit provided from a circuit side edge on which the circuit connection end is provided towards the interior of the second connection portion. The second connection portion may include a first inner slit connected to the edge slit and extending along the circuit side edge. The second connection portion may include a second inner slit connected to the edge slit, and extending along the circuit side edge and towards an opposite side of the first inner slit. The first connection portion and the third connection portion may be arranged side by side in a direction parallel to the main surface of the second connection portion. The first connection portion may have a first parallel slit extending from an edge facing the third connection portion in a direction parallel to the first inner slit. The third connection portion may have a second parallel slit extending from an edge facing the first connection portion in a direction parallel to the second inner slit.

The semiconductor device may further include a fourth connection portion formed of a planar conductive material and connected to any of the circuit portions. The first connection portion may be arranged to face a first main surface of the second connection portion. The fourth connection portion may be arranged to face a second main surface of the second connection portion. The fourth connection portion may include the circuit connection end and the path restriction portion. The directions of the currents flowing through the current paths between the path restriction portions and the circuit connection ends may be different in the fourth connection portion and the second connection portion.

The path restriction portions of the first connection portion, the second connection portion, and the fourth connection portion may include one or more first slit extending in a first direction. A current flowing through the first connection portion and a current flowing through the fourth connection portion may flow to the second connection portion. A width of the first slit in the second connection portion may be larger than either of a width of the first slit in the first connection portion and a width of the first slit in the fourth connection portion.

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention will be described through embodiments of the invention, but the following embodiments do not limit the invention according to the claims. In addition, not all combinations of features described in the embodiments are necessarily essential to the solution of the invention.

In this specification, one side in a direction parallel to the depth direction of the semiconductor substrate that the semiconductor chip has is referred to as "upper", and the other side is referred to as "lower". One of two main surfaces of a substrate, a layer or some other member is referred to as an upper surface, and the other surface is referred to as a lower surface. The "upper", "lower", "front", and "back" directions are not limited to the gravitational direction or the direction of attachment to a substrate or the like at the time of implementation of a semiconductor device.

In this specification, technical matters may be described using orthogonal coordinate axes of X-axis, Y-axis and Z-axis. In this specification, a surface parallel to the upper surface of a semiconductor chip is referred to as an XY-plane, and an axis perpendicular to the XY-plane is referred to as a Z-axis.

In addition, in this specification, distances, resistance values, current sizes or the like may be described as being equal. Cases where they are equal are not limited to cases where they are identical, and they may be different within the scope of the invention described herein. For example, being equal allows errors within 10%.

Figure 1:
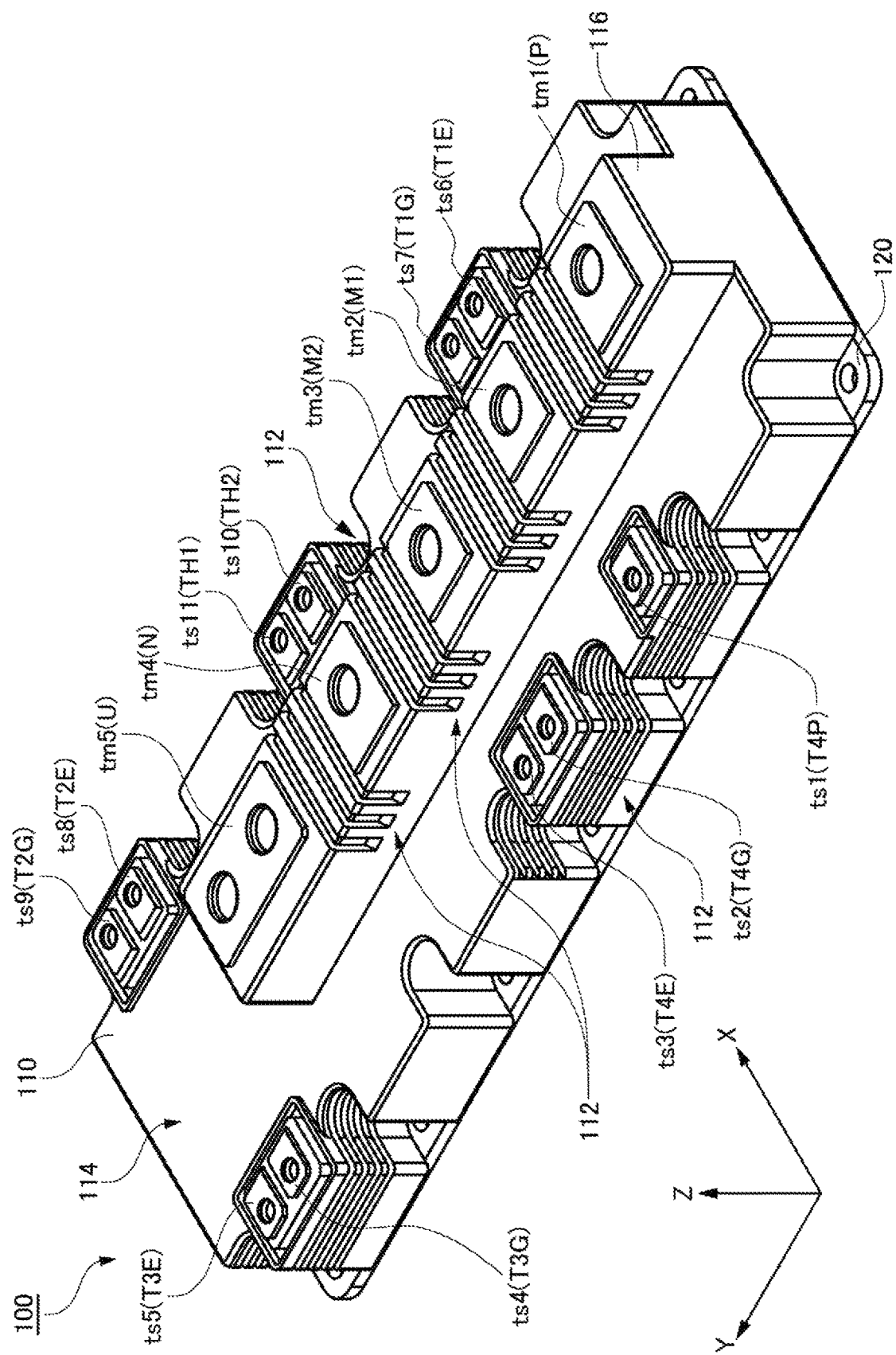
FIG. 1 shows an example of a perspective view of a semiconductor device 100 according to one example of the present invention.

FIG. 1 shows an example of a perspective view of a semiconductor device 100 according to one example of the present invention. The semiconductor device 100 includes a casing portion 110, a base portion 120, and a plurality of terminals. In one example, the semiconductor device 100 is used in a power conditioner (PCS: Power Conditioning Subsystem).

The casing portion 110 accommodates an internal circuit such as a semiconductor chip and wiring. The casing portion 110 is formed of insulative resin. The casing portion 110 is provided on the base portion 120. The casing portion 110 may be provided with a notch portion 112 to increase the creepage distance to enhance insulation.

The base portion 120 is fixed to the casing portion 110 with an adhesive or the like on the upper-surface side. The base portion 120 may be set to the ground potential. The base portion may be fixed to a heat dissipating member such as a fin with a screw or the like, on the lower surface side. The base portion 120 has a main surface in the XY-plane. The base portion 120 and the casing portion 110 may have two sets of opposing edges, as seen in an upper surface view from the Z-axis direction. The base portion 120 and the casing portion 110 of the present example have longer edges along the Y-axis, and have shorter edges along the X-axis.

A terminal arrangement surface 114 is a surface on which the plurality of terminals is exposed in the upper-surface side of the casing portion 110. Each terminal electrically connects the internal circuit accommodated in the casing portion 110 to an external device. The first auxiliary terminal ts1 to the eleventh auxiliary terminal ts11 are provided on the terminal arrangement surface 114. The terminal arrangement surface 114 has a convex portion 116 protruding in the Z-axis direction.

The convex portion 116 is provided near the center of the terminal arrangement surface 114, as seen in an upper surface view. The convex portion 116 of the present example is arranged extending along the Y-axis direction at the center in the X-axis direction of the terminal arrangement surface 114. A first external connection terminal tm1 to a fifth external connection terminal tm5 are provided on the convex portion 116. The first external connection terminal tm1 to the fifth external connection terminal tm5 are arranged in order along the Y-axis direction in the convex portion 116, but the arrangement of the external connection terminals is not limited thereto.

The first external connection terminal tm1 (P) is a terminal to which a positive terminal of a direct power supply provided external to the semiconductor device 100 is connected. The fourth external connection terminal tm4 (N) is a terminal to which a negative terminal of the external direct power supply is connected. The first external connection terminal tm1 (P) and the fourth external connection terminal tm4 (N) function as power supply terminals P, N in the internal circuit of the semiconductor device 100.

The fifth external connection terminal tm5 (U) functions as an AC output terminal U in the internal circuit of the semiconductor device 100. The second external connection terminal tm2 (M1) and the third external connection terminal tm3 (M2) are connected to predetermined connection points in the internal circuit of the semiconductor device 100. For example, the second external connection terminal tm2 (M1) and the third external connection terminal tm3 (M2) function as intermediate terminals M1, M2 which clamp the voltage of the predetermined connection points in the internal circuit of the semiconductor device 100.

The first auxiliary terminal ts1 to the fifth auxiliary terminal ts5 are arranged along one edge (the longer edge in the present example) along the Y-axis of the terminal arrangement surface 114. The sixth auxiliary terminal ts6 to the eleventh auxiliary terminal ts11 are arranged along the other edge along the Y-axis direction of the terminal arrangement surface 114.

The first auxiliary terminal ts1 (T4P) outputs a collector voltage of a transistor T4 described below. The second auxiliary terminal ts2 (T4G) is a gate terminal supplying a gate voltage of the transistor T4. The third auxiliary terminal ts3 (T4E) outputs an emitter voltage of the transistor T4.

The fourth auxiliary terminal ts4 (T3G) is a gate terminal supplying a gate voltage of a transistor T3 described below. The fifth auxiliary terminal ts5 (T3E) outputs an emitter voltage of the transistor T3.

The sixth auxiliary terminal ts6 (T1E) outputs an emitter voltage of a transistor T1 described below. The seventh auxiliary terminal ts7 (T1G) is a gate terminal supplying a gate voltage of the transistor T1.

The eighth auxiliary terminal ts8 (T2E) outputs an emitter voltage of a transistor T2 described below. The ninth auxiliary terminal ts9 (T2G) is a gate terminal supplying a gate voltage of the transistor T2.

The tenth auxiliary terminal ts10 (TH2) and the eleventh auxiliary terminal ts11 (TH1) are terminals for thermistors, which are connected to a thermistor to detect the internal temperature of the casing portion 110. For example, the thermistor is embedded in the casing portion 110 under the tenth auxiliary terminal ts10 (TH2) and the eleventh auxiliary terminal ts11 (TH1).

Figure 2:
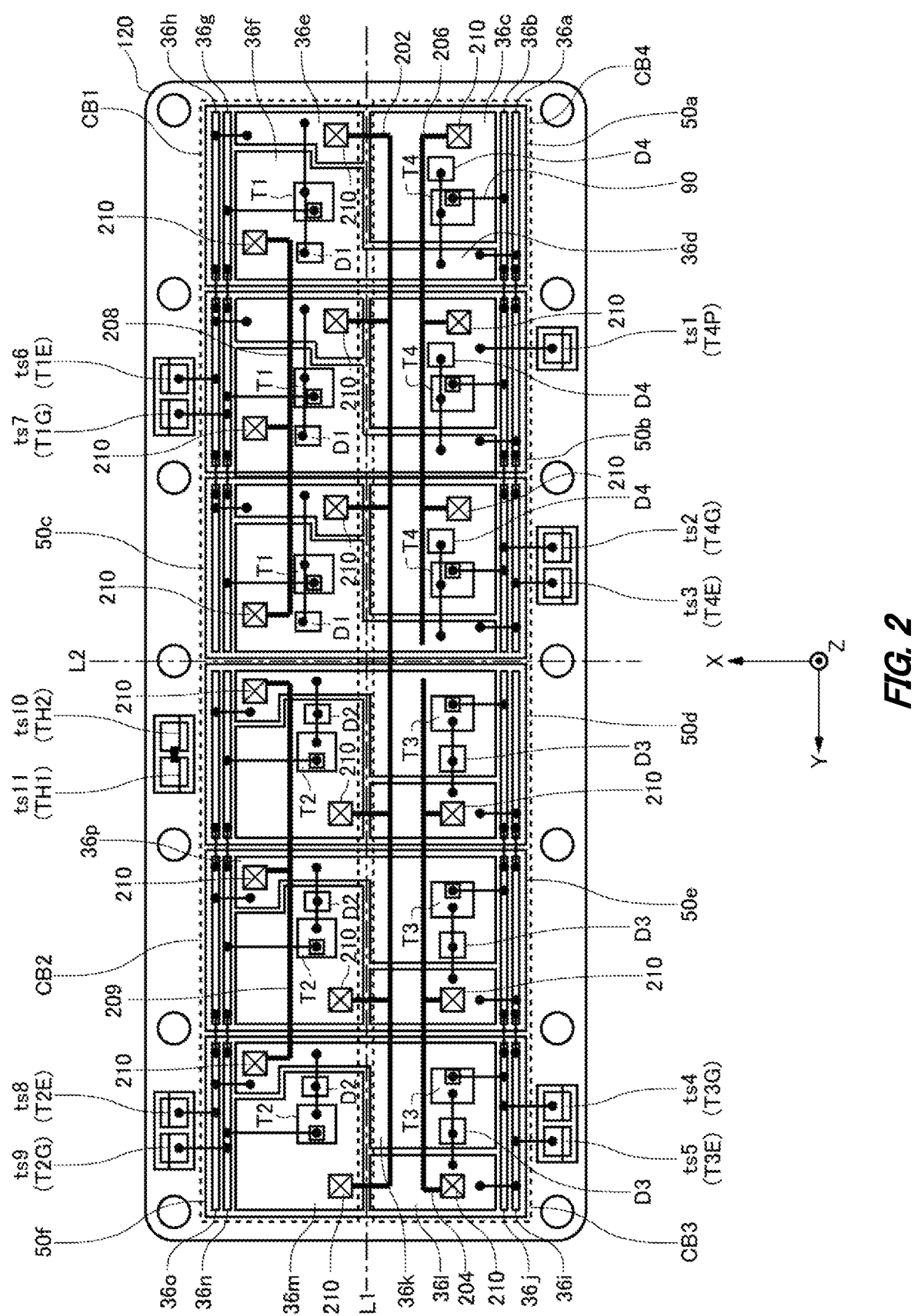
FIG. 2 is an example of a plan view of the semiconductor device 100.

FIG. 2 is an example of a plan view of the semiconductor device 100. This figure shows an exemplary arrangement of an internal circuit provided on a base portion 120, in the interior of a casing portion 110. The internal circuit of the present example is a three-level power conversion device (an inverter) circuit, but the internal circuit is not limited thereto.

The semiconductor device 100 of the present example includes six insulating substrates 50a-50f on the base portion 120. These six insulating substrates 50a, 50b, 50c, 50d, 50e, 50f of the present example are arranged side by side along the Y-axis direction in this order. The insulating substrates 50 are bonded to the base portion 120. The insulating substrates 50 includes conductivity patterns on both sides of ceramic (alumina, for example) substrates having high heat-conductivity. For example, the insulating substrates 50 are DCB (Direct Copper Bonding) substrates that have copper circuit boards directly bonded to ceramic substrates.

One or more transistors T may be arranged on each of the insulating substrates 50. Each of the transistors T may be an insulated gate bipolar transistor (IGBT) or a field effect transistor (FET). FIG. 2 shows a semiconductor chip with the transistors T provided thereon. The semiconductor device 100 of the present example includes a plurality of transistors connected to each other in parallel. In the example shown in FIG. 2, three transistors T1 are connected in parallel. Similarly, three transistors T2 are connected in parallel, three transistors T3 are connected in parallel, and three transistors T4 are connected in parallel. In this specification, a plurality of transistors Tk (k is an integer) connected in parallel may be collectively referred to as the transistor Tk.

A plurality of transistors Tk connected in parallel may be arranged side by side along a predetermined first direction (Y-axis direction in FIG. 2). In the present example, the plurality of transistors T1 and the plurality of transistors T2 are arranged side by side along one of the longer edges of the base portion 120, and the plurality of transistors T3 and the plurality of transistors T4 are arranged side by side along the other longer edge of the base portion 120.

In addition, the transistors T1 and T4 may be implemented on the same insulating substrate 50. The transistors T2 and T3 may be implemented on the same insulating substrate 50. The insulating substrates 50a-50c are insulating substrates each having the transistors T4 and T1 implemented thereon. The insulating substrates 50d-50f are insulating substrates each having the transistors T3 and T2 implemented thereon.

In addition, each of the insulating substrates 50 may be provided with diodes Dk. The diodes Dk may be Free Wheel Diodes connected to the transistors Tk in reverse parallel. Although diodes Dk are provided for each of the transistors Tk in the present example, diodes Dk may be provided for some of the transistors Tk in other examples. In addition, although the transistors and the diodes of the present example are each provided on separate semiconductor chips, they may be a reverse conducting IGBT (RC-IBGT) or the like with transistors and diodes provided on a same semiconductor chip.

In the present example, the region on which the insulating substrates 50 are provided is divided into four circuit blocks CB1-CB4, as seen in an upper surface view. The first circuit block CB1 is a region on which the plurality of transistors T1 provided in parallel is provided, the second circuit block CB2 is a region on which the plurality of transistors T2 provided in parallel is provided, the third circuit block CB3 is a region on which the plurality of transistors T3 provided in parallel is provided, and the fourth circuit block CB4 is a region on which the plurality of transistors T4 provided in parallel is provided. Each of the circuit blocks CBk may be provided with the diodes Dk.

The circuit blocks CB1-CB4 of the present example are divided by virtual centerlines L1 and L2. The centerline L2 divides the base portion 120 into a region on which the insulating substrates 50a, 50b, and 50c are provided and a region on which the insulating substrates 50d, 50e, and 50f are provided. The centerline L2 of the present example is a straight line parallel to the X-axis that runs between the insulating substrate 50c and the insulating substrate 50d.

The centerline L1 divides the insulating substrates 50a, 50b, and 50c into a region on which the plurality of transistors T1 is provided, and a region on which the plurality of transistors T4 is provided. In addition, the centerline L1 divides the insulating substrates 50d, 50e, and 50f into a region on which the plurality of transistors T2 is provided and a region on which the plurality of transistors T3 is provided. The centerline L1 of the present example is a straight line parallel to the Y-axis that runs through the center in the X-axis direction of a region on which the insulating substrates 50 are provided.

The semiconductor device 100 has a plurality of conductivity patterns 36 provided on the insulating substrates 50. The conductivity patterns 36 are formed of conductive materials such as copper. In addition, the semiconductor device 100 has a plurality of connection members 90 that electrically connects each member in the internal circuit. The connection members 90 are wiring provided over the insulating substrates 50, such as wires or lead frames, for example. In FIG. 2, the connection members 90 are shown with solid lines. In addition, the connection points of the connection members 90 and other members are shown with filled circles. The connection members 90 are connected to other members at the connection points by means of direct bonding, soldering or the like.

In each of the insulating substrates 50a-50c, a conductivity pattern 36a is provided at one end in the X-axis direction. The conductivity pattern 36a electrically connects an emitter pad of the corresponding transistor T4 and an anode pad of the diode D4 to a third auxiliary terminal ts3 (T4E).

In each of the insulating substrates 50a-50c, a conductivity pattern 36b is provided at one end in the X-axis direction. The conductivity pattern 36b electrically connects a gate pad of the corresponding transistor T4 to a second auxiliary terminal ts2 (T4G). The conductivity patterns 36a and 36b of the present example are wiring arranged in the fourth circuit block CB4 and having a longitudinal side in the Y-axis direction.

A conductivity pattern 36c is provided on each of the insulating substrates 50a-50c. The conductivity pattern 36c of the present example has the transistor T4 and the diode D4 provided thereon. The conductivity pattern 36c is connected to a collector electrode of the transistor T4 and a cathode electrode of the diode D4, via soldering or the like. In addition, each of the conductivity patterns 36c is electrically connected to the first auxiliary terminal ts1 (T4P).

A conductivity pattern 36d is provided on each of the insulating substrates 50a-50c. The conductivity pattern 36d of the present example electrically connects an emitter pad of the transistor T4 and an anode pad of the diode D4 to the conductivity pattern 36a. The conductivity patterns 36c and 36d are arranged in the fourth circuit block CB4.

In each of the insulating substrates 50a-50c, a conductivity pattern 36h is provided at one end in the X-axis direction. The conductivity pattern 36h electrically connects an emitter pad of the corresponding transistor T1 and an anode pad of the diode D1 to a sixth auxiliary terminal ts6 (T1E).

In each of the insulating substrates 50a-50c, a conductivity pattern 36g is provided at one end in the X-axis direction. The conductivity pattern 36g electrically connects a gate pad of the corresponding transistor T1 to a seventh auxiliary terminal ts7 (T1G). The conductivity patterns 36h and 36g of the present example are wiring arranged in the first circuit block CB1 and having a longitudinal side in the Y-axis direction.

The conductivity pattern 36f is provided on each of the insulating substrates 50a-50c. The conductivity pattern 36f of the present example has the transistor T1 and the diode D1 provided thereon. The conductivity pattern 36f is connected to a collector electrode of the transistor T1 and a cathode electrode of the diode D1, via soldering or the like. The conductivity pattern 36f of the present example and the conductivity pattern 36d are provided in series. In this manner, the collector pad of the transistor T1 and the emitter pad of the transistor T4 are electrically connected to each other.

The conductivity pattern 36e is provided on each of the insulating substrates 50a-50c. The conductivity pattern 36e of the present example electrically connects an emitter pad of the transistor T1 and an anode pad of the diode D1 to the conductivity pattern 36h. The conductivity patterns 36f and 36e are arranged in the first circuit block CB1.

In each of the insulating substrates 50d-50f, a conductivity pattern 36i is provided at one end in the X-axis direction. The conductivity pattern 36i electrically connects an emitter pad of the corresponding transistor T3 and an anode pad of the diode D3 to a fifth auxiliary terminal ts5 (T3E).

In each of the insulating substrates 50d-50f, a conductivity pattern 36j is provided at one end in the X-axis direction. The conductivity pattern 36j electrically connects a gate pad of the corresponding transistor T3 to a fourth auxiliary terminal ts4 (T3G). The conductivity patterns 36i and 36j of the present example are wiring arranged in the third circuit block CB3 and having a longitudinal side in the Y-axis direction.

The conductivity pattern 36k is provided on each of the insulating substrates 50d-50f. The conductivity pattern 36k of the present example has the transistor T3 and the diode D3 provided thereon. The conductivity pattern 36k is connected to a collector electrode of the transistor T3 and a cathode electrode of the diode D3, via soldering or the like.

The conductivity pattern 36l is provided on each of the insulating substrates 50d-50f. The conductivity pattern 36l of the present example electrically connects an emitter pad of the transistor T3 and an anode pad of the diode D3 to the conductivity pattern 36i. The conductivity patterns 36k and 36l are arranged in the third circuit block CB3.

In each of the insulating substrates 50d-50f, a conductivity pattern 36o is provided at one end in the X-axis direction. The conductivity pattern 36o electrically connects an emitter pad of the corresponding transistor T2 and an anode pad of the diode D2 to an eighth auxiliary terminal ts8 (T2E).

In each of the insulating substrates 50d-50f, a conductivity pattern 36n is provided at one end in the X-axis direction. The conductivity pattern 36n electrically connects a gate pad of the corresponding transistor T2 to a ninth auxiliary terminal ts9 (T2G). The conductivity patterns 36o and 36n of the present example are wiring arranged in the second circuit block CB2 and having a longitudinal side in the Y-axis direction.

The conductivity pattern 36m is provided on each of the insulating substrates 50d-50f. The conductivity pattern 36m of the present example has the transistor T2 and the diode D2 provided thereon. The conductivity pattern 36m is connected to a collector electrode of the transistor T2 and a cathode electrode of the diode D2, via soldering or the like.

The conductivity pattern 36p is provided on each of the insulating substrates 50d-50f. The conductivity pattern 36p of the present example electrically connects an emitter pad of the transistor T2 and an anode pad of the diode D2 to the conductivity pattern 36o. The conductivity patterns 36m and 36p are arranged in the second circuit block CB2. The conductivity pattern 36p of the present example and the conductivity pattern 36k are provided in series. In this manner, the collector pad of the transistor T3 and the emitter pad of the transistor T2 are electrically connected to each other.

The semiconductor device 100 of the present example includes a inter-block connection portion 202, a first intra-block connection portion 204, a second intra-block connection portion 206, a third intra-block connection portion 208, and a fourth intra-block connection portion 209. The inter-block connection portion 202 electrically connects two circuit blocks CB. The inter-block connection portion 202 of the present example electrically connects the first circuit block CB1 and the second circuit block CB2.

The inter-block connection portion 202 is electrically connected to any of the circuit devices in each circuit block CB. The inter-block connection portion 202 of the present example is connected to the plurality of conductivity patterns 36e on the first circuit block CB1 and the plurality of conductivity patterns 36m on the second circuit block CB2.

Each of the intra-block connection portions is electrically connected to a plurality of circuit devices within one circuit block CB. The first intra-block connection portion 204 of the present example is connected to the plurality of conductivity patterns 36l on the third circuit block CB3. The second intra-block connection portion 206 of the present example is connected to the plurality of conductivity patterns 36c on the fourth circuit block CB4. The third intra-block connection portion 208 of the present example is connected to the plurality of conductivity patterns 36f on the first circuit block CB1. The fourth intra-block connection portion 209 of the present example is connected to the plurality of conductivity patterns 36p on the second circuit block CB2.

The inter-block connection portion 202 and the intra-block connection portions may be plate-like conductive members arranged over the insulating substrate 50. At least some of the plate portion of the inter-block connection portion 202 and the intra-block connection portions may be arranged perpendicular to the insulating substrate 50. The inter-block connection portion 202 and the intra-block connection portions may be formed of conductive materials such as copper, aluminum or the like. In FIG. 2, the regions connected to the inter-block connection portion 202 or the intra-block connection portions in each of the conductivity patterns 36 are shown as connection regions 210.

Figure 3:
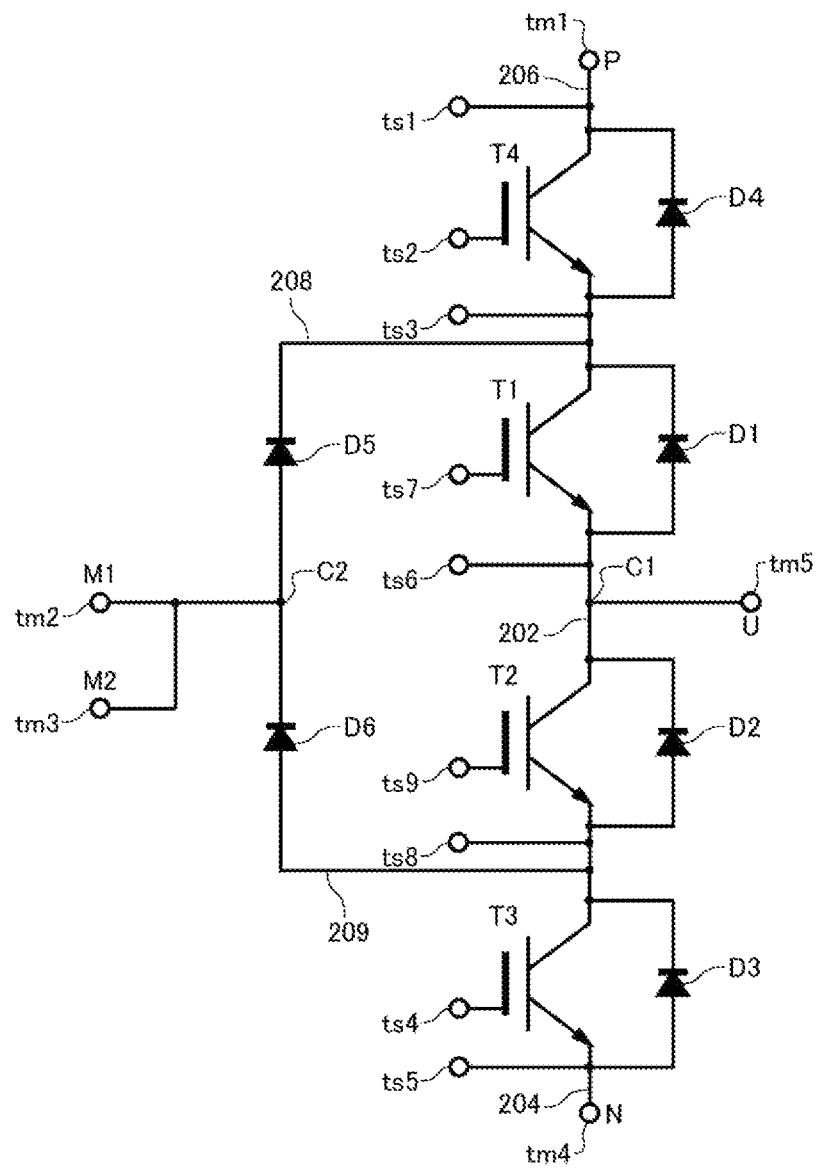
FIG. 3 shows an example of a circuit configuration in the internal circuit of the semiconductor device 100.

FIG. 3 shows an example of a circuit configuration in an internal circuit of the semiconductor device 100. The internal circuit of the present example is a circuit with one phase (U-phase) of the three phases (the U-phase, the V-phase, and the W-phase) of a three-level power conversion (inverter) circuit.

The transistor T4, the transistor T1, the transistor T2, and the transistor T3 are connected in series in this order between the first external connection terminal tm1 (P) and the fourth external connection terminal tm4 (N). Each of the transistors Tk includes a plurality of transistors connected in parallel, as described in FIG. 2, but is shown as one transistor in the circuit in FIG. 3. For example, the plurality of transistors T4 is connected to each other in parallel, the plurality of transistors T1 is connected to each other in parallel, and the plurality of transistors T4 and the plurality of transistors T1 are connected in series. The diodes Dk are connected to each of the transistors Tk in reverse parallel.

The connection point between an emitter terminal of the transistor T1 and a collector terminal of the transistor T2 is assumed as the connection point C1. The connection point C1 is connected to the fifth external connection terminal tm5 (U) as an AC output terminal.

A collector terminal of the transistor T1 and an emitter terminal of the transistor T2 are connected via two diodes D5, D6 provided in series. The diodes D5 and D6 are arranged so that the direction from the emitter terminal of the transistor T2 towards the collector terminal of the transistor T1 is a forward direction. Note that, the diodes D5, D6 are omitted in FIG. 2. The diodes D5, D6 may be provided on the conductivity pattern 36, may be provided at the third intra-block connection portion 208 or the fourth intra-block connection portion 209, or may be provided at other locations.

The connection point between the diodes D5 and D6 is assumed as the connection point C2. The connection point C2 is connected to the second external connection terminal tm2 (M1) and the third external connection terminal tm3 (M2). Such a configuration allows the internal circuit to operate as an I-type three-level power conversion circuit in which four transistors T are connected in series.

Figure 4A:
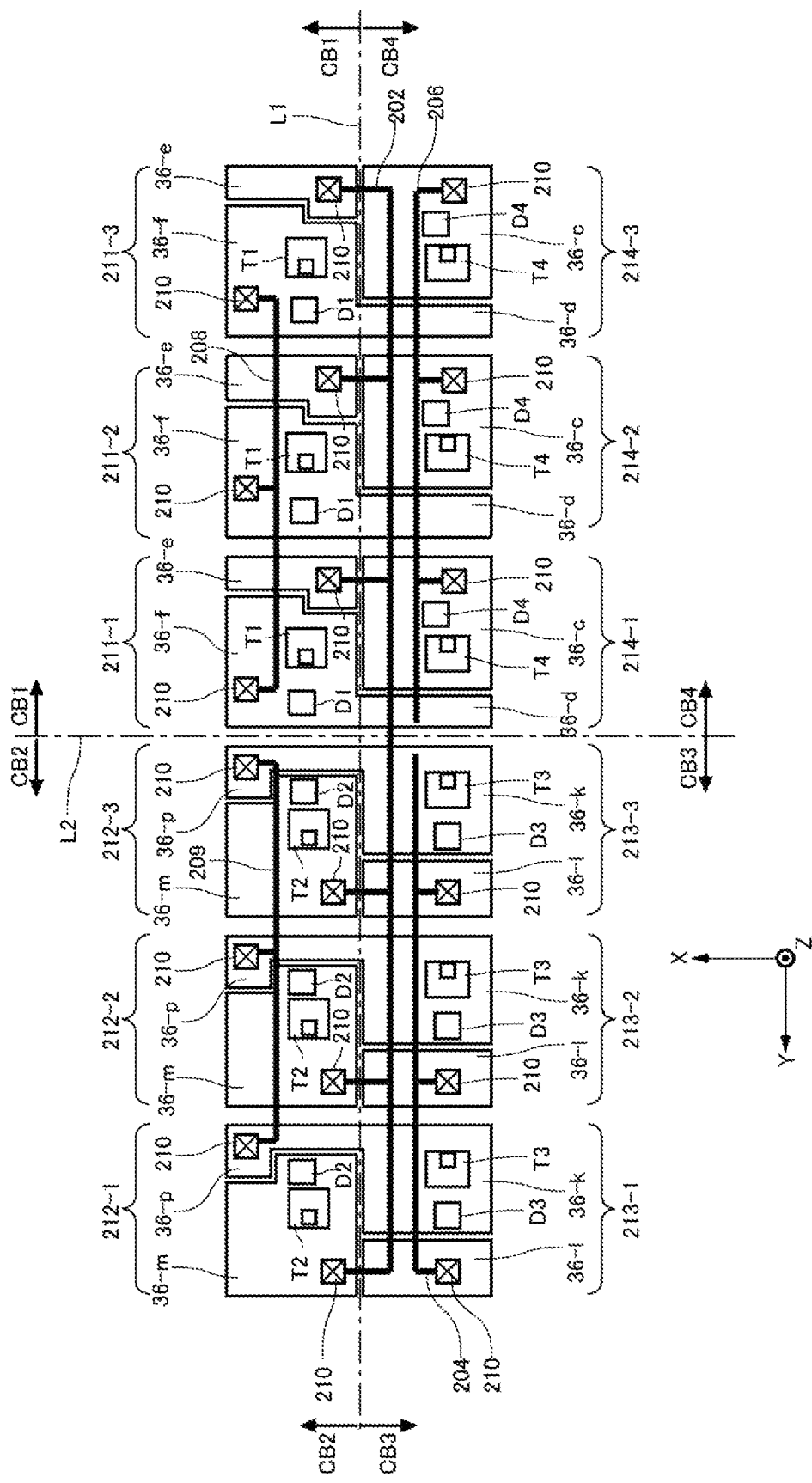
FIG. 4A schematically describes each of the circuit blocks CB.

FIG. 4A schematically describes each of the circuit blocks CB. The first circuit block CB1 has a plurality of first circuit portions 211 connected in parallel. Each of the first circuit portions 211 of the present example includes a conductivity pattern 36-e and a conductivity pattern 36-f, and the transistor T1 and the diode D1 that are arranged on these conductivity patterns.

The second circuit block CB2 has a plurality of second circuit portions 212 connected in parallel. Each of the second circuit portions 212 of the present example includes a conductivity pattern 36-m and a conductivity pattern 36-p, and the transistor T2 and the diode D2 that are arranged on these conductivity patterns.

The third circuit block CB3 has a plurality of third circuit portions 213 connected in parallel. Each of the third circuit portions 213 of the present example includes a conductivity pattern 36-k and a conductivity pattern 36-1, and the transistor T3 and the diode D3 that are arranged on these conductivity patterns.

The fourth circuit block CB4 has a plurality of fourth circuit portions 214 connected in parallel. Each of the fourth circuit portions 214 of the present example includes a conductivity pattern 36-c and a conductivity pattern 36-d, and the transistor T4 and the diode D4 that are arranged on these conductivity patterns.

The first circuit block CB1 and the second circuit block CB2 of the present example are arranged side by side along a first direction (Y-axis direction). Similarly, the third circuit block CB3 and the fourth circuit block CB4 are arranged side by side along the first direction (Y-axis direction). In addition, the first circuit block CB1 and the fourth circuit block CB4 are arranged side by side in a second direction (X-axis direction). Similarly, the second circuit block CB2 and the third circuit block CB3 are arranged side by side in the second direction (X-axis direction). Note that, as shown in FIG. 2, in the present example, the first direction (Y-axis direction) is a direction parallel to the longer edge of the base portion 120. In addition, in the present example, the second direction (X-axis direction) is a direction parallel to the shorter edge of the base portion 120.

In addition, the plurality of circuit portions in each of the circuit blocks CB are arranged side by side along the first direction (Y-axis direction). For example, the first circuit portions 211-1, 211-2, 211-3 are arranged side by side along the first direction. Note that, that the circuit portions are arranged side by side along the first direction means that the location of each of the circuit portions in the first direction is different. In a direction perpendicular to the first direction (X-axis direction in the present example), each circuit portion may or may not be arranged at the same location. Each circuit portion may have portions overlapping with a straight line that is parallel to the first direction.

As described above, the inter-block connection portion 202 connects the first circuit block CB1 to the second circuit block CB2. That is, the inter-block connection portion 202 connects each of the plurality of first circuit portions 211 to each of the plurality of second circuit portions 212.

Figure 4B:
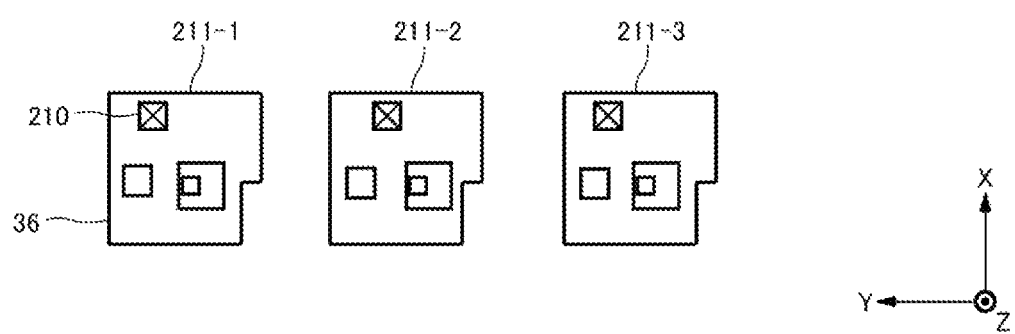
FIG. 4B shows an example of a first circuit portion 211 arranged side by side along the first direction.

FIG. 4B shows an example of first circuit portions 211 arranged side by side along a first direction. The location of each of the first circuit portions 211 in the first direction (Y-axis) is different. Note that, the center of gravity of the shape in the XY-plane of the conductivity pattern on which the connection region 210 is provided may be used as the location of each of the first circuit portions 211. In the present example, the location of each of the first circuit portions 211 in the X-axis is identical.

Figure 4C:
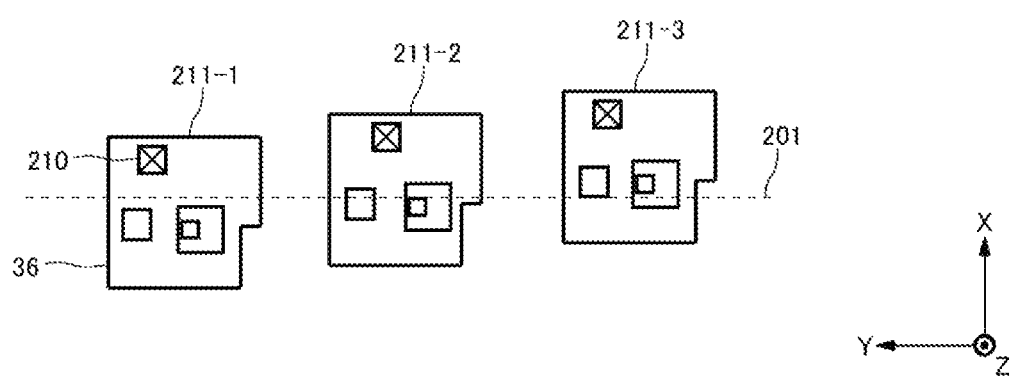
FIG. 4C shows another example of the first circuit portion 211 arranged side by side along the first direction.

FIG. 4C shows another example of the first circuit portions 211 arranged side by side along the first direction. The location of each of the first circuit portions 211 in the first direction (Y-axis) is different, in the present example as well. In the present example, each of the first circuit portions 211 is arranged at different locations in the X-axis direction. Such a form is also included as those arranged side by side along the first direction herein. Note that, each of the first circuit portions 211 of the present example is arranged so that a straight line 201 parallel to the first direction that passes through the conductivity patterns 36 of the first circuit portions 211 exists. In other examples, at least one of the first circuit portions 211 may be arranged so that the conductivity patterns 36 do not overlap with the straight line 201.

Figure 4D:
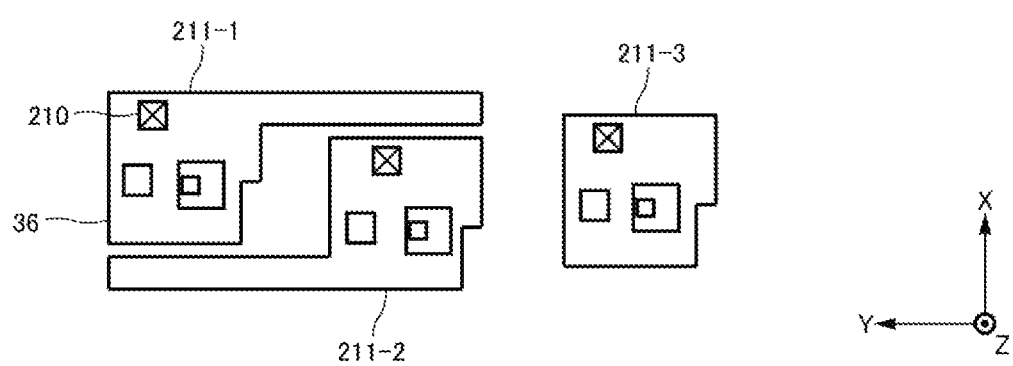
FIG. 4D shows another example of the first circuit portion 211 arranged side by side along the first direction.

FIG. 4D shows another example of the first circuit portions 211 arranged side by side along the first direction. The location of each of the first circuit portions 211 in the first direction (Y-axis) is different, in the present example as well. In the present example, at least one of the first circuit portions 211 have a portion that overlaps with other ones of the first circuit portions 211 in the X-axis direction. Such a form is also included as those arranged side by side along the first direction herein.

FIGS. 4B-4D are described using the first circuit portions 211, but the same applies to other circuit portions. In addition, the same applies to the circuit blocks CB. FIGS. 4B-4D describes a situation in which the circuit blocks CB are arranged side by side in the first direction, but the same applies to situations in which they are arranged side by side in other directions.

Figure 5:
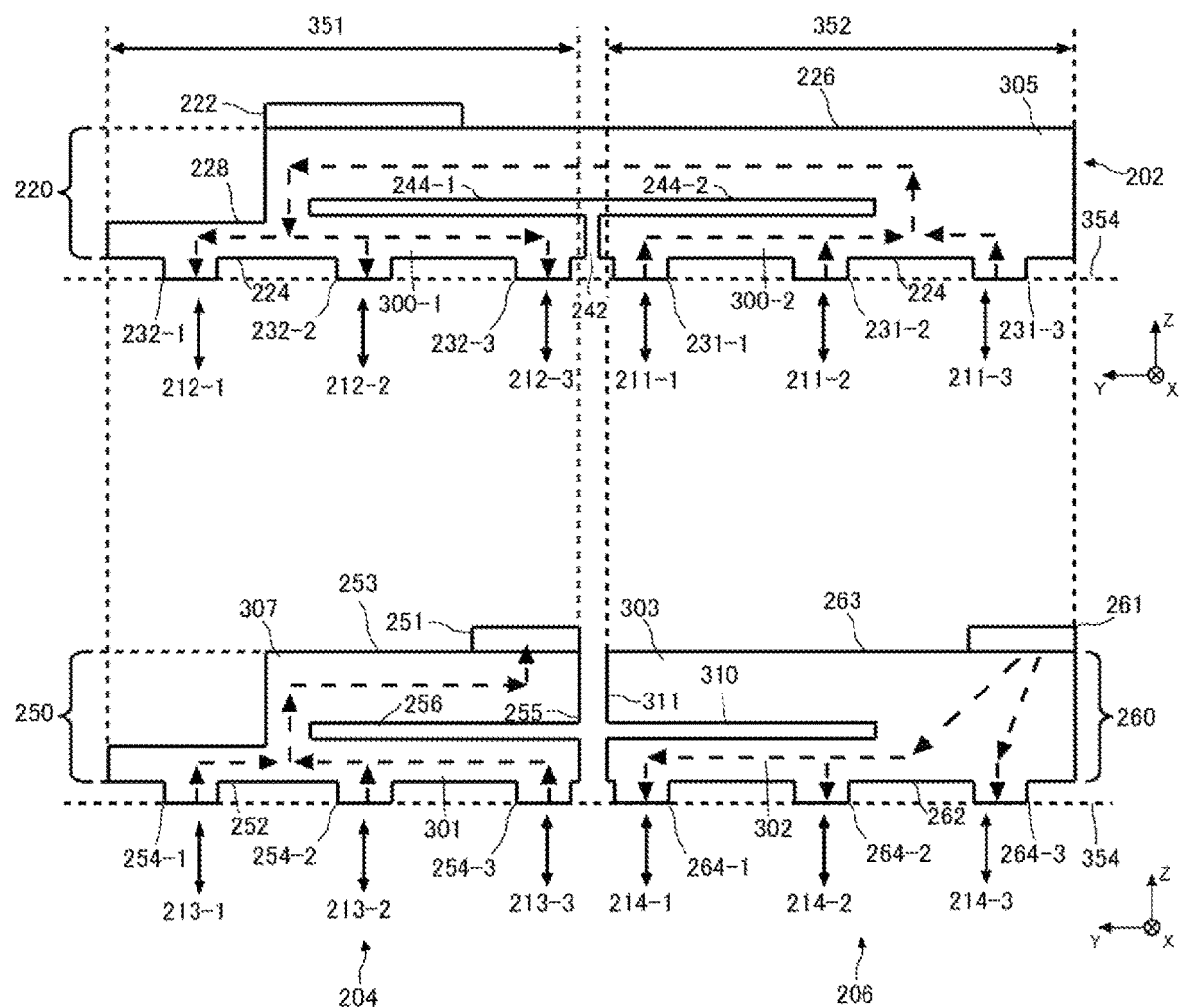
FIG. 5 shows exemplary shapes of an inter-block connection portion 202, a first intra-block connection portion 204, and a second intra-block connection portion 206.

FIG. 5 shows exemplary shapes of an inter-block connection portion 202, a first intra-block connection portion 204, and a second intra-block connection portion 206. In FIG. 5, the shapes in the YZ-plane of inter-block connection portion 202, the first intra-block connection portion 204, and the second intra-block connection portion 206 are shown. Note that, in FIG. 5, the inter-block connection portion 202, the first intra-block connection portion 204, and the second intra-block connection portion 206 are schematically shown on the same YZ-plane. As shown in FIG. 2, the locations on the X-axis on which the inter-block connection portion 202 is provided is different from those on which the first intra-block connection portion 204, and the second intra-block connection portion 206 are provided. The first intra-block connection portion 204 of the present example is an example of the first connection portion, the inter-block connection portion 202 is an example of the second connection portion, and the second intra-block connection portion 206 is an example of the third connection portion.

Each of the connection portions is formed of a planar conductive material and is connected to any of the circuit portions. In the present example, the inter-block connection portion 202 is connected to a plurality of first circuit portions 211 and a plurality of second circuit portions 212, the first intra-block connection portion 204 is connected to a plurality of third circuit portions 213, and the second intra-block connection portion 206 is connected to a plurality of fourth circuit portions 214.

Planar herein refers to a shape in which each area of the two main surfaces arranged opposing each other is larger than areas of any other surfaces. Each area of the main surfaces may be five times or larger than the largest area among areas of other surfaces. In FIG. 5, the main surface 305 of the plate portion 220 is parallel to the YZ-plane.

The inter-block connection portion 202 and the first intra-block connection portion 204 are arranged with respective main surfaces facing each other. Respective main surfaces facing each other refers to a configuration in which the normal line at any position in one of the main surfaces passes the other main surface. In the present example, the main surface 305 of the inter-block connection portion 202 and the main surface 307 of the first intra-block connection portion 204 are arranged in parallel. Note that, in the example shown in FIG. 5, the main surface on the side opposite to the main surface 307 of the first intra-block connection portion 204 is arranged to face the main surface 305 of the inter-block connection portion 202.

Two surfaces being parallel, herein, includes arrangements in which the two surfaces are arranged strictly in parallel, as well as with a predetermined minute angle. The minute angle may be within five degrees. In the present example, the main surface 305 of the inter-block connection portion 202 and the main surface 307 of the first intra-block connection portion 204 are both parallel to the YZ-plane.

The inter-block connection portion 202 and the second intra-block connection portion 206 are arranged with respective main surfaces facing each other. In the present example, the main surface 305 of the inter-block connection portion 202 and the main surface 303 of the second intra-block connection portion 206 are arranged in parallel.

In the present example, the first intra-block connection portion 204 and the second intra-block connection portion 206 are both arranged to face the same main surface 305 of the inter-block connection portion 202. That is, the first intra-block connection portion 204 and the second intra-block connection portion 206 are arranged on the same side relative to the inter-block connection portion 202. The first intra-block connection portion 204 and the second intra-block connection portion 206 of the present example are arranged side by side in the Y-axis direction.

In addition, the inter-block connection portion 202 and the first intra-block connection portion 204 include an overlapping region 351 that overlaps when viewed from a direction perpendicular to the main surface 305 or the main surface 307 (X-axis direction in the present example). In the present example, the inter-block connection portion 202 has an overlapping region 351 that overlaps with the first intra-block connection portion 204 and an overlapping region 352 that overlaps with the second intra-block connection portion 206. The overlapping region 351 and the overlapping region 352 of the present example are arranged side by side in the Y-axis direction.

Each of the connection portions includes a path restriction portion for restricting the current path in the main surface. The path restriction portion restricts the current path in the main surface of the connection portion by increasing the resistance value of the current path of the current flowing through at least one circuit portion. In the example of FIG. 5, the path restriction portion is a slit provided in the plate portion of the each connection portion. The slit is a groove penetrating the plate portion in the X-axis direction, which diverts the current flow through at least one circuit portion to increase the length of the current path. In this manner, the resistance value of the current path is increased relative to when there is no slit. Note that, the path restriction portion is not limited to a slit, as long as it increases the resistance value of the current path. As an example, in some parts of the plate portion and each connection end, a path restriction portion made of a material having a higher resistivity than other parts may be provided, a path restriction portion having less thickness in the X-axis direction than other parts may be provided, or a path restriction portion which is a meshed region formed of a plurality of through holes may be provided. For example, a member made of a high-resistivity material may be provided instead of the slit, a region with less thickness may be provided instead of the slit, or a meshed region may be provided with a plurality of through holes, at the location where the slit shown in FIG. 5 is provided.

Each connection portion includes a plate portion. The inter-block connection portion 202 of the present example has a plate portion 220, the first intra-block connection portion 204 has a plate portion 250, and the second intra-block connection portion 206 has a plate portion 260.

Each connection portion has a circuit connection end connected to the circuit portion. The circuit connection end may protrude from the edge that is closest to the circuit portion of the plate portion towards the circuit portion. The inter-block connection portion 202 of the present example includes, on the edge 224, a plurality of first connection ends 231 connected to the first circuit portion 211 and a plurality of second connection ends 232 connected to the second circuit portion 212. The first intra-block connection portion 204 of the present example includes, on the edge 252, a plurality of third connection ends 254 connected to the third circuit portion 213. The second intra-block connection portion 206 of the present example includes, on the edge 262, a plurality of fourth connection ends 264 connected to the fourth circuit portion 214.

The end on the first circuit portion 211 side of the first connection end 231 is arranged at a location 354 on the Z-axis. The end on the second circuit portion 212 side of the second connection end 232 is may be arranged at the location 354 on the Z-axis. The end on the third circuit portion 213 side of the third connection end 254 may be arranged at the location 354 on the Z-axis. The end on the fourth circuit portion 214 side of the fourth connection end 264 may be arranged at the location 354 on the Z-axis. Note that, the locations in the Z-axis direction of each connection end may be different.

Each connection portion has slits at locations away from the edge, in the Z-axis direction, on which the circuit connection end is provided. The slits may be provided extending in the Y-axis direction (that is, the slits may have a longitudinal end in the Y-axis direction). The inter-block connection portion 202 of the present example has a first inner slit 244-1 and a second inner slit 244-2 extending in the Y-axis direction, at locations away from the edge 224. The first intra-block connection portion 204 of the present example has a first parallel slit 256 extending in the Y-axis direction, at a location away from the edge 252. The first parallel slit 256 may be arranged to be parallel to the first inner slit 244-1.

The second intra-block connection portion 206 of the present example has a second parallel slit 310 extending in the Y-axis direction, at a location away from the edge 262. The second parallel slit 310 may be arranged to be parallel to the second inner slit 244-2. The first inner slit 244-1 and the first parallel slit 256 are arranged in the overlapping region 351. The second inner slit 244-2 and the second parallel slit 310 are arranged in the overlapping region 352.

Each connection portion includes a current path between the slit extending in the Y-axis direction and the circuit connection end. The current path may be provided extending in the Y-axis direction (that is, the current path may have a longitudinal direction in the Y-axis direction). The inter-block connection portion 202 of the present example has a current path 300-1 between the edge 224 and the first inner slit 244-1, and a current path 300-2 between the edge 224 and the second inner slit 244-2. The current path 300-1 and the current path 300-2 of the present example are arranged to be separated in the Y-axis direction. The first intra-block connection portion 204 of the present example has a current path 301 between the edge 252 and the first parallel slit 256. The second intra-block connection portion 206 of the present example has a current path 302 between the edge 262 and the second parallel slit 310. The current path 300-1 and the current path 301 are arranged in the overlapping region 351. The current path 300-2 and the current path 302 are arranged in the overlapping region 352.

At least portions of the current path 300-1 and the current path 301 may be overlapped, when viewed from the X-axis direction. The area of the overlapping region of the current path 300-1 and the current path 301 may be a half or more of the area of the current paths, when viewed from the X-axis direction. At least portions of the current path 300-2 and the current path 302 may be overlapped, when viewed from the X-axis direction. The area of the overlapping region of the current path 300-2 and the current path 302 may be a half or more of the area of the current paths, when viewed from the X-axis direction.

The second intra-block connection portion 206 of the present example includes an external connection end 261 that functions as the first external connection terminal tm1 (P) as described in FIG. 3 and the like. In addition, the first intra-block connection portion 204 includes an external connection end 251 that functions as the fourth external connection terminal tm4 (N) as described in FIG. 3 and the like. As described in FIG. 3 and the like, in the semiconductor device 100 of the present example, the current flows from the external connection end 261 of the second intra-block connection portion 206 through the fourth connection end 264, the first connection end 231 of the inter-block connection portion 202, second connection end 232 of the inter-block connection portion 202, the third connection end 254 of the first intra-block connection portion 204, and the external connection end 251 of the first intra-block connection portion 204, in this order. In each figure, the direction of the current on the main surface of each connection portion is shown with dashed arrows.

In the present example, the direction of the current flowing to the current path 300-1 of the inter-block connection portion 202 is different from the direction of the current flowing through the current path 301 of the first intra-block connection portion 204. For example, in the current path 300-1, the current flowing to the second connection end 232-3 flows toward the negative direction of the Y-axis. On the contrary, in the current path 301, the current flowing to the third connection end 254-3 flows toward the positive direction of the Y-axis. Similarly, in the current path 300-2, the current flowing to the first connection end 231-1 flows toward the negative direction of the Y-axis. On the contrary, in the current path 302, the current flowing to the fourth connection end 264-1 flows toward the positive direction of the Y-axis.

In this manner, mutual electromagnetic induction between two connection portions arranged to oppose each other in the X-axis direction can be suppressed by configuring the directions of the current in the current path arranged to oppose each other in the X-axis direction to be different. The directions of the currents in current paths arranged to oppose each other in the X-axis direction are preferably opposite. Opposite direction includes arrangement in which the directions of currents are precisely 180 degrees different, as well as with a predetermined angle error. The angle error is 45 degrees or less, for example. Such configuration may suppress the occurrence of oscillation or noise in voltages and currents. Note that, the closer the distance between the connection portions, the larger the mutual electromagnetic induction between the connection portions becomes. The distance in the X-axis direction between the inter-block connection portion 202 and the first intra-block connection portion 204 may be 1 cm or less, or may be 0.5 mm or less. The distance in the X-axis direction between the inter-block connection portion 202 and the second intra-block connection portion 206 may be 1 cm or less, or may be 0.5 mm or less.

For each of the inter-block connection portion 202 and the first intra-block connection portion 204, the circuit connection ends and the slits are arranged such that at least a portion of the currents circulates around the slits. The current circulating around the slits refers to a case where there is a region in which the direction of the current becomes the opposite in a region adjacent to the slits. In the present example, the directions of the current are opposite in the region between the first inner slit 244-1 and the edge 224 and the region between the first inner slit 244-1 and the edge 226.

For example, in the inter-block connection portion 202, the current flowing to the second connection end 232-3 circulates anti-clockwise around the first inner slit 244-1. On the contrary, in the first intra-block connection portion 204, the current flowing from the third connection end 254-3 circulates clockwise around the first parallel slit 256. In this manner, the directions of the current circulating around the slits becomes opposite between the two opposing connection portions, thereby further suppressing the mutual electromagnetic induction between the two connection portions.

The directions of the current circulating around the slits may also be opposite in the inter-block connection portion 202 and the second intra-block connection portion 206. For example, in the inter-block connection portion 202, the current flowing from the first connection end 231-1 circulates anti-clockwise around the second inner slit 244-2. On the contrary, in the second intra-block connection portion 206, the current flowing to the fourth connection end 264-1 may circulate clockwise around the second parallel slit 310.

First Example

The inter-block connection portion 202 of the present embodiment includes a plate portion 220, a plurality of first connection ends 231, and a plurality of second connection ends 232. The plate portion 220 may be a plate member that extends from above the first circuit portion 211-3 arranged at one end to above the second circuit portion 212-1 arranged at the other end, among the first circuit portions 211 and the second circuit portions 212 arranged side by side in the Y-axis direction. The plate portion 220 may be provided perpendicular to the XY-plane. The plate portion 220 includes an edge 224 opposing the circuit block CB, and an edge 226 on a side opposite to the edge 224.

The first connection ends 231 are provided for each of the first circuit portions 211. The first connection ends 231 protrude from the edge 224 of the plate portion 220 towards the first circuit portion 211, and are connected to the first circuit portions 211 at the connection regions 210. The second connection ends 232 are provided for each of the second circuit portions 212. The second connection ends 232 protrude from the edge 224 of the plate portion 220 towards the second circuit portion 212, and are connected to the second circuit portions 212 at the connection regions 210. In FIG. 5, the first connection ends 231 and the second connection ends 232 are schematically shown. Each connection end may have a portion extending in parallel with the XY-plane, and may have a curved portion.

In the semiconductor device 100, current may flow between the first circuit block CB1 and the second circuit block CB2, via the inter-block connection portion 202. For example, in the circuit shown in FIG. 3, in a short-circuit state in which the transistors T1 and T2 are turned on at the same time, current may flow between the transistors T1 and T2.

The plurality of second circuit portions 212 in the second circuit block CB2 are arranged side by side along the Y-axis direction. Thus, the length of the current path between each of the second circuit portions 212 and the first circuit block CB1 is different. The size of the current flowing to each of the second circuit portions 212 may vary, since electrical resistance is determined in accordance with the length of the current path. The breakdown voltage of the semiconductor device 100 will be reduced if the current between the plurality of circuit portions provided in parallel varies. For example, the peak value of the short-circuit current flowing to the semiconductor device 100 may become larger.

The inter-block connection portion 202 of the present example has at least a path restriction portion that increases a resistance value in the current path 230 from the first circuit block CB1 to the second circuit portion 212-3. The second circuit portion 212-3 is a second circuit portion 212 arranged closest to the first circuit block CB1 in the second circuit block CB2. A longer current path 230 to the second circuit portion 212-3 may efficiently improve the breakdown voltage of the semiconductor device 100, since current is most likely to concentrate at the second circuit portion 212-3 which is closest to the first circuit portion block CB1.

In addition, the path restriction portion may increase a resistance value in a current path from the second circuit block CB2 to the first circuit portion 211-1. The first circuit portion 211-1 is a first circuit portion 211 arranged closest to the second circuit block CB2 in the first circuit block CB1. A longer current path to the first circuit portion 211-1 may efficiently improve the breakdown voltage of the semiconductor device 100, since current is most likely to concentrate at the first circuit portion 211-1.

The path restriction portion of the present example may be a T-shaped slit, as shown in FIG. 5. The inter-block connection portion 202 has an edge slit 242, a first inner slit 244-1, and a second inner slit 244-2. The edge slit 242 is provided between the first connection end 231-1 and the second connection end 232-3 on the edge 224 of the plate portion 220, and extends from the edge 224 to the interior of the plate portion 220. The first connection end 231-1 is a first connection end 231 arranged closest to the second connection end 232 among the plurality of first connection ends 231. The second connection end 232-3 is a second connection end 232 arranged closest to the first connection end 231 among the plurality of second connection ends 232. The edge slit 242 may be arranged at the center between the first connection end 231-1 and the second connection end 232-3. The edge slit 242 may extend parallel to the Z-axis direction from the edge 224.

The first inner slit 244-1 is connected to the edge slit 242 in the plate portion 220, and extends along the edge 224 towards the first connection end 231. The first inner slit 244-1 may be provided parallel to the edge 224 or may be inclined against the edge 224. The first inner slit 244-1 may extend outward beyond at least the first connection end 231-1. Outward refers to the direction away from the edge slit 242 on the Y-axis. The first inner slit 244-1 of the present example may extend to the first connection end 231-2, among the plurality of first connection ends 231, arranged at the center in the Y-axis direction, or may extend outward beyond the first connection end 231-2. Such an arrangement enables averaging of the lengths of the current paths corresponding to each of the first connection ends 231. The first inner slit 244-1 may not extend to a location opposing, in the Z-axis direction, the first connection end 231-3 arranged outermost among the plurality of first connection ends 231.

The second inner slit 244-2 is connected to the edge slit 242 in the plate portion 220, and extends along the edge 224 towards the second connection end 232. The second inner slit 244-2 may be provided parallel to the edge 224 or may be inclined against the edge 224. The first inner slit 244-1 and the second inner slit 244-2 are arranged away from the edge 224 in the Z-axis direction. As an example, the first inner slit 244-1 and the second inner slit 244-2 are connected to the upper end in the Z-axis direction of the edge slit 242, and each may extend in the Y-axis direction.

The second inner slit 244-2 may extend outward beyond at least the second connection end 232-3. The second inner slit 244-2 of the present example may extend to the second connection end 232-2, among the plurality of second connection ends 232, arranged at the center in the Y-axis direction, or may extend outward beyond the second connection end 232-2. Such an arrangement enables averaging of the lengths of the current paths corresponding to each of the second connection ends 232. The second inner slit 244-2 may not extend to a location opposing, in the Z-axis direction, the second connection end 232-1 arranged outermost among the plurality of second connection ends 232.

Such a structure allows the length of the current path to the first circuit portion 211-1, the second circuit portion 212-3 and the like arranged inside to increase. Thus, the electrical resistance value of these current paths can be increased.

The inter-block connection portion 202 of the present example has an external connection end 222 provided thereon. The external connection end 222 may protrude upward from the edge 226. The external connection end 222 of the present example functions as the fifth external connection terminal tm5 (U).

The plate portion 220 of the present example may have a narrow region 228 having a smaller width in the Z-axis direction than other regions. For example, the narrow region 228 is arranged in a region without a convex portion 116 in FIG. 1, and other parts of the plate portion 220 besides the narrow region 228 are arranged under the convex portion 116. That is, a narrow region 228 may be provided in the plate portion 220, depending on the shape or the like of the casing portion 110. The width of the plate portion 220 between the inner slit 244 and the edge 224 may be the same as the width of the narrow region 228, or may be smaller than the width. By setting the width of each portion as described above, the variation in the resistance values of the current path of the second circuit portion 212-1 in which the narrow region 228 is included, and the current path of the other second circuit portions 212 can be reduced.

In addition, in the semiconductor device 100, the current may flow in a U-shape or a C-shape between the plurality of circuit blocks CB. For example, when the first external connection terminal tm1 (P) and the fourth external connection terminal tm4 (N) are short-circuited, the current flows in a U-shape through the fourth circuit block CB4, the first circuit block CB1, the second circuit block CB2, and the third circuit block CB3, in this order. In addition, when the second external connection terminal tm2 (M1) and the fourth external connection terminal tm4 (N) are short-circuited, the current flows in a C-shape through the first circuit block CB1, the second circuit block CB2, and the third circuit block CB3, in this order. In addition, when the third external connection terminal tm3 (M2) and the first external connection terminal tm1 (P) are short-circuited, the current flows in a C-shape through the second circuit block CB2, the first circuit block CB1, and the fourth circuit block CB4, in this order.

When the current flows around the internal circuit in a U-shape or a C-shape, the current path to the circuit portion arranged closer to the circulating center of the current is likely to become shorter than the current path to the circuit portion arranged away from the circulating center. Since the current path of the circuit portion arranged closest to the circulating center can be increased with the inter-block connection portion 202 of the present example, the overall balance of the lengths of the current paths may be improved.

Note that, although the inter-block connection portion 202 in FIG. 5 had a first inner slit 244-1 and a second inner slit 244-2, it may have either one of the first inner slit 244-1 or the second inner slit 244-2 in other examples. Even in such cases, the inner slit 244 is connected to the edge slit 242.

The first intra-block connection portion 204 of the present example has a plate portion 250, a plurality of third connection ends 254, and an external connection end 251. The plate portion 250 may be a plate member extending from above the third circuit portion 213-1 arranged at one end to above the third circuit portion 213-3 arranged at the other end, among the plurality of third circuit portions 213 arranged side by side in the Y-axis direction. The plate portion 250 may be provided perpendicular to the XY-plane. The plate portion 250 has an edge 252 opposing the third circuit block CB3, and an edge 253 on a side opposite to the edge 252.

The third connection ends 254 are provided for each of the third circuit portions 213. The third connection ends 254 protrude from the edge 252 of the plate portion 250 towards the third circuit portion 213, and are connected to the third circuit portions 213. In FIG. 5, the third connection ends 254 are shown schematically. The third connection ends 254 may have a portion extending in parallel with the XY-plane, and may have a curved portion. The external connection end 251 may protrude upward from the edge 253.

The plate portion 250 of the present example has a first parallel slit 256 provided thereon. The first parallel slit 256 may be provided such that it traverses the shortest straight line that links the third connection end 254-3, among the third connection ends 254, arranged closest to the fourth circuit block CB4 with the external connection end 251. In this manner, the first parallel slit 256 elongates the current path between the external connection end 251 and the third connection end 254-3, and allows the resistance value of the current path to the third connection end 254-3 to increase. Thus, the current flowing to the third circuit portion 213-3 arranged closer to the circulating center of the current can be reduced. The first parallel slit 256 of the present example is provided such that it traverses the shortest straight line that links the third connection end 254-2 with the external connection end 251.

As an example, the first parallel slit 256 is a straight-line slit. The end of the first parallel slit 256 extends from either edge of the plate portion 250 to the interior of the plate portion 250. The first parallel slit 256 of the present example is provided on the edge 255, among the edges parallel to the Z-axis of the plate portion 250, that is closest to the third connection end 254-3. The edge 255 is a edge opposing the second intra-block connection portion 206 in the first intra-block connection portion 204.

In the present example, the external connection end 251 is arranged to be closer to the fourth circuit block CB4 than the center Yc of the plate portion 250 in the first direction (Y-axis direction). The external connection end 251 may be provided at the end on the edge 255 side, on the edge 253 of the plate portion 250.

The second intra-block connection portion 206 of the present example has a plate portion 260, a plurality of fourth connection ends 264, and an external connection end 261. The plate portion 260 may be a plate member extending from above the fourth circuit portion 214-1 arranged at one end to above the fourth circuit portion 214-3 arranged at the other end, among the plurality of fourth circuit portions 214 arranged side by side in the Y-axis direction. The plate portion 260 may be provided perpendicular to the XY-plane. The plate portion 260 has an edge 262 opposing the fourth circuit block CB4, and an edge 263 on a side opposite to the edge 262.

The fourth connection ends 264 are provided for each of the fourth circuit portions 214. The fourth connection ends 264 protrude from the edge 262 of the plate portion 260 towards the fourth circuit portion 214, and are connected to the fourth circuit portions 214. In FIG. 5, the fourth connection ends 264 are shown schematically. The fourth connection ends 264 may have a portion extending in parallel with the XY-plane, and may have a curved portion. The external connection end 261 may protrude upward from the edge 263.

The plate portion 260 of the present example has a second parallel slit 310 provided thereon. The second parallel slit 310 may be provided such that it traverses the shortest straight line that links the fourth connection end 264-1, among the fourth connection ends 264, arranged closest to the third circuit block CB3 with the external connection end 261. In this manner, the second parallel slit 310 elongates the current path between the external connection end 261 and the fourth connection end 264-1, and allows the resistance value of the current path to the fourth connection end 264-1 to increase. Thus, the current flowing to the fourth circuit portion 214-1 arranged closer to the circulating center of the current can be reduced.

As an example, the second parallel slit 310 is a straight-line slit. The end of the second parallel slit 310 extends from either edge of the plate portion 260 to the interior of the plate portion 260. The second parallel slit 310 of the present example is provided on the edge 311, among the edges parallel to the Z-axis of the plate portion 260, that is closest to the fourth connection end 264-1. The edge 311 is an edge opposing the first intra-block connection portion 204 in the second intra-block connection portion 206.

In the present example, the external connection end 261 is arranged to be on the side opposite to the third circuit block CB3 than the center Yc of the plate portion 250 in the first direction (Y-axis direction). The external connection end 261 may be provided at the end on the side opposite to the third circuit block CB3, on the edge 263 of the plate portion 260.

The location of the external connection terminal of the intra-block connection portion shown in FIG. 5 is limited by the shape of the casing portion 110, arrangement of the external device, and the like. On the contrary, by adjusting whether to have a slit provided in the intra-block connection portion, depending on the location of the external connection terminal, as shown in FIG. 5, the variation in resistance values of the current path in the entire circuit can be reduced.

Figure 6:
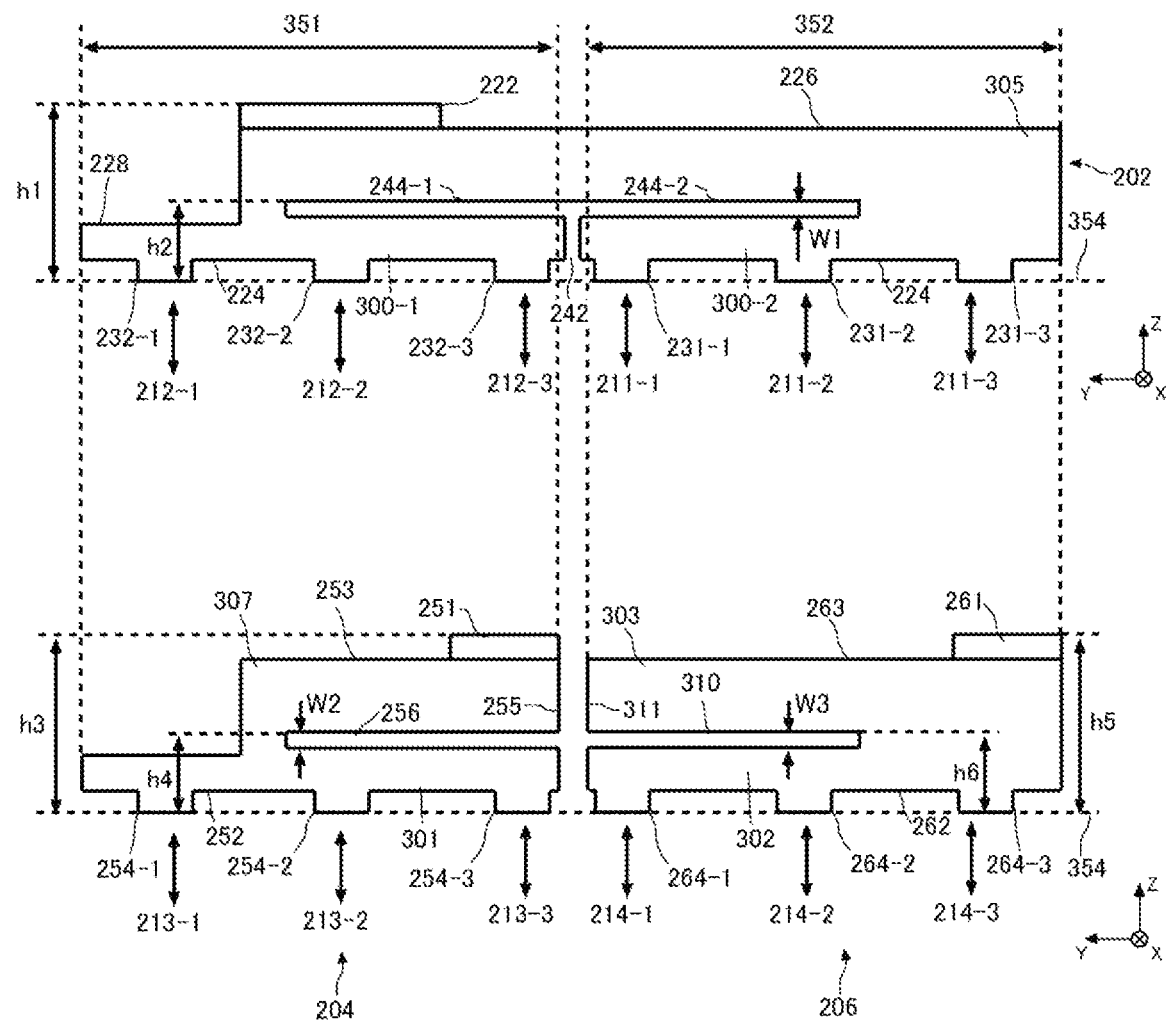
FIG. 6 describes the positions of slits in each connection portion.

FIG. 6 describes the positions of slits in each connection portion. The height of the inter-block connection portion 202 is h1, the height location of the first inner slit 244-1 and the second inner slit 244-2 is h2, the height of the first intra-block connection portion 204 is h3, the height location of the first parallel slit 256 is h4, the height of the second intra-block connection portion 206 is h5, and the height location of the second parallel slit 310 is h6. The height of each connection portion is the length in the Z-axis direction from the location 354 to the upper end of each connection portion. The upper end of each connection portion may be the upper end of the external connection terminal, or may be the upper end of the plate portion. The height location of each slit is the location in the Z-axis direction of the upper end of each slit relative to the location 354. In addition, the width in the Z-axis direction of the first inner slit 244-1 and the second inner slit 244-2 is W1, the width in the Z-axis direction of the first parallel slit 256 is W2, and the width in the Z-axis direction of the second parallel slit 310 is W3.

The height location h4 of the first parallel slit 256 may be the same as the height location h2 of the first inner slit 244-1. The height location being the same includes cases in which the locations are precisely the same, as well as with a predetermined error. The error may be smaller than the width W1 of the first inner slit 244-1, or may be smaller than the width W2 of the first parallel slit 256. By providing the first inner slit 244-1 and the first parallel slit 256 at the same height location, it becomes easier to suppress the mutual electromagnetic induction between the inter-block connection portion 202 and the first intra-block connection portion 204.

The height location h6 of the second parallel slit 310 may be the same as the height location h2 of the second inner slit 244-2. The height location being the same includes cases in which the locations are precisely the same, as well as with a predetermined error. The error may be smaller than the width W1 of the second inner slit 244-2, or may be smaller than the width W3 of the second parallel slit 310. By providing the second inner slit 244-2 and the second parallel slit 310 at the same height location, it becomes easier to suppress the mutual electromagnetic induction between the inter-block connection portion 202 and the second intra-block connection portion 206.

Note that, in case where the height h1 of the inter-block connection portion 202 and the height h3 of the first intra-block connection portion 204 are different, the height location h4 of the first parallel slit 256 and the height location h2 of the first inner slit 244-1 may be different. For example, when the height h1 is higher than the height h3, the height location h2 is higher than the height location h4. Similarly, when the height h1 is lower than the height h3, the height location h2 is lower than the height location h4. In this way, it becomes easier to suppress the mutual electromagnetic induction between the inter-block connection portion 202 and the first intra-block connection portion 204. Similarly, in case where the height h1 of the inter-block connection portion 202 and the height h5 of the second intra-block connection portion 206 are different, the height location h6 of the second parallel slit 310 and the height location h2 of the second inner slit 244-2 may be different.

Second Example

Figure 7:
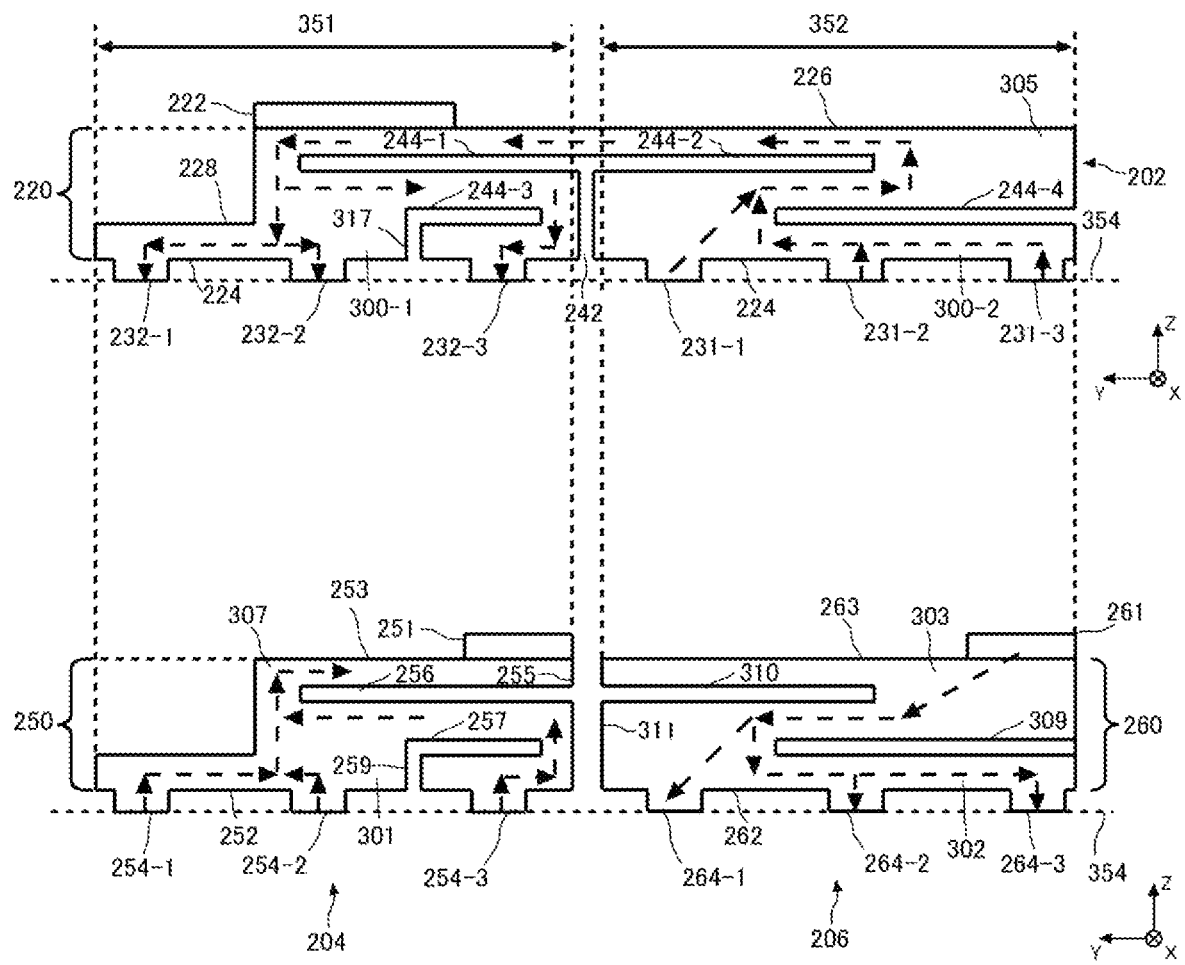
FIG. 7 shows another exemplary arrangement of the slits in each connection portion.

FIG. 7 shows another exemplary arrangement of the slits in each connection portion. The inter-block connection portion 202 of the present example has a third inner slit 244-3, a fourth inner slit 244-4, and an edge slit 317, in addition to the components shown in FIG. 5.

The edge slit 317 and the third inner slit 244-3 are provided in the overlapping region 351. The edge slit 317 and the third inner slit 244-3 are arranged to be closer to the edge 224 than the first inner slit 244-1. The edge slit 317 is a slit extending in the Z-axis direction from the edge 224. The edge slit 317 of the present example is provided on the edge 224 between the second connection end 232-2 and second connection end 232-3. The third inner slit 244-3 is connected to the edge slit 317 and extends in the Y-axis direction. The third inner slit 244-3 of the present example is provided to extend from the edge slit 317 inward beyond the second connection end 232-3. Inward refers to the side closer to the edge slit 242. Such configuration allows further adjustment of the resistance value of the current path connected to the second connection end 232-3.

The first intra-block connection portion 204 of the present example has a third parallel slit 257 and a slit 259, in addition to the components shown in FIG. 5. The third parallel slit 257 and the slit 259 are provided in the overlapping region 351. The slit 259 and the third parallel slit 257 are arranged to be closer to the edge 252 than the first parallel slit 256. The slit 259 is a slit extending in the Z-axis direction from the edge 252. The slit 259 of the present example is provided on the edge 252 between the third connection end 254-2 and the third connection end 254-3. The third parallel slit 257 is connected to the slit 259 and extends in the Y-axis direction. The third parallel slit 257 of the present example is provided to extend from slit 259 inward beyond the third connection end 254-3. Inward refers to the side closer to the edge 255. Such configuration allows further adjustment of the resistance value of the current path connected to the third connection end 254-3.

In the overlapping region 351, the slits of the inter-block connection portion 202 and the slits of the first intra-block connection portion 204 are preferably arranged in a similar manner Being arranged in a similar manner may refer to an arrangement in which each slit overlaps when viewed from the X-axis direction. In addition, in the inter-block connection portion 202 and the first intra-block connection portion 204 in the overlapping region 351, the number of slits extending in a first direction (the Y-axis direction, for example) are preferably the same. In the present example, the number of slits extending in the Y-axis direction in the inter-block connection portion 202 is two (the first inner slit 244-1, the third inner slit 244-3), and the number of slits extending in the Y-axis direction in the first intra-block connection portion 204 is two (the first parallel slit 256, the third parallel slit 257). Similarly, in the inter-block connection portion 202 and the first intra-block connection portion 204 in the overlapping region 351, the number of slits extending in a second direction that is different from the first direction (the Z-axis direction, for example) are also preferably the same. In the present example, the number of slits extending in the Z-axis direction in the inter-block connection portion 202 is one (the edge slit 317), and the number of slits extending in the Z-axis direction in the first intra-block connection portion 204 is one (the slit 259). By arranging slits in a similar manner in two opposing connection portions, it becomes easier to suppress the mutual electromagnetic induction between the two connection portions.

Note that, in the overlapping region 352, the slits of the inter-block connection portion 202 and the slits of the second intra-block connection portion 206 are also preferably arranged in a similar manner. The second intra-block connection portion 206 of the present example has a fourth parallel slit 309, in addition to the components shown in FIG. 5. The fourth parallel slit 309 is a slit extend in the Y-axis direction from the edge on the side opposite to the edge 311. The height location of the fourth parallel slit 309 is between the second parallel slit 310 and the location 354. The fourth parallel slit 309 may extend inward beyond the fourth connection end 264-3, or may extend inward beyond the fourth connection end 264-2. Inward refers to a side closer to the edge 311. The fourth parallel slit 309 of the present example extends to a location between the fourth connection end 264-3 and the fourth connection end 264-2.

In addition, the fourth inner slit 244-4 of the inter-block connection portion 202 is a slit that extends in the Y-axis direction from the edge on the side opposite to the edge slit 242 in the overlapping region 352. The height location of the fourth inner slit 244-4 is between the second inner slit 244-2 and the location 354. The fourth inner slit 244-4 may extend inward beyond the first connection end 231-3, or may extend inward beyond the first connection end 231-2. Inward refers to a side closer to the edge slit 242. The fourth inner slit 244-4 of the present example extends to a location between the first connection end 231-3 and the first connection end 231-2.

In the inter-block connection portion 202 and the second intra-block connection portion 206 in the overlapping region 352, the number of slits extending in a first direction (the Y-axis direction, for example) are preferably the same. In the present example, the number of slits extending in the Y-axis direction in the inter-block connection portion 202 is two (the second inner slit 244-2, the fourth inner slit 244-4), and the number of slits extending in the Y-axis direction in the second intra-block connection portion 206 is two (the second parallel slit 310, the fourth parallel slit 309). Similarly, in the inter-block connection portion 202 and the second intra-block connection portion 206 in the overlapping region 352, the number of slits extending in a second direction (the Z-axis direction, for example) are also preferably the same. In the present example, in both the inter-block connection portion 202 and the second intra-block connection portion 206, the number of slits extending in the second direction (the Z-axis direction, for example) is zero.

Figure 8:
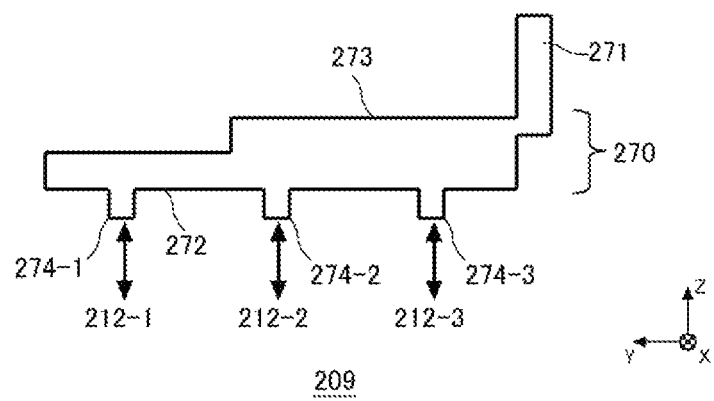
FIG. 8 shows an exemplary shape of a fourth intra-block connection portion 209.

FIG. 8 shows an exemplary shape of a fourth intra-block connection portion 209. The fourth intra-block connection portion 209 has a plate portion 270, a plurality of fifth connection ends 274, and an external connection end 271. The plate portion 270 may be a plate member extending from above the second circuit portion 212-1 arranged at one end to above the second circuit portion 212-3 arranged at the other end, among the plurality of second circuit portions 212 arranged side by side in the Y-axis direction. The plate portion 270 may be provided perpendicular to the XY-plane.

The plate portion 270 has an edge 272 opposing the second circuit block CB2, and an edge 273 on a side opposite to the edge 272.

The fifth connection ends 274 are provided for each of the second circuit portions 212. The fifth connection ends 274 protrude from the edge 272 of the plate portion 270 towards the second circuit portion 212, and are connected to the second circuit portions 212. In FIG. 8, the fifth connection ends 274 are shown schematically. The fifth connection ends 274 may have a portion extending in parallel with the XY-plane, and may have a curved portion.

The external connection end 271 may protrude upward from the edge 273. The external connection end 271 of the present example functions as the third external connection terminal tm3 (M2).

Slits may or may not be provided in the plate portion 270 of the fourth intra-block connection portion 209. When providing the slits, slits that are similar to those provided on the plate portion 250 shown in FIG. 5 may be provided on the plate portion 270. In the fourth intra-block connection portion 209 of the present example, the distance from other connection portions in the X-axis direction is larger than 1 cm. The distance may be 2 cm or more. Therefore, the mutual electromagnetic induction between the fourth intra-block connection portion 209 and other connection portions is relatively small. Thus, oscillation and noise can be suppressed without providing slits to regulate the current path to pass a current in the opposite direction.

Figure 9:
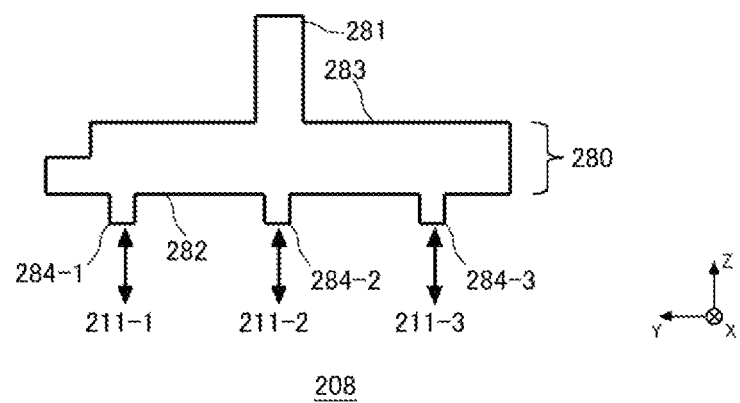
FIG. 9 shows an exemplary shape of a third intra-block connection portion 208.

FIG. 9 shows an exemplary shape of a third intra-block connection portion 208. The third intra-block connection portion 208 has a plate portion 280, a plurality of sixth connection ends 284, and an external connection end 281. The plate portion 280 may be a plate member extending from above the first circuit portion 211-1 arranged at one end to above the first circuit portion 211-3 arranged at the other end, among the plurality of first circuit portions 211 arranged side by side in the Y-axis direction. The plate portion 280 may be provided perpendicular to the XY-plane. The plate portion 280 has an edge 282 opposing the first circuit block CB1, and an edge 283 on a side opposite to the edge 282.

The sixth connection ends 284 are provided for each of the first circuit portions 211. The sixth connection ends 284 protrude from the edge 282 of the plate portion 280 towards the first circuit portion 211, and are connected to the first circuit portions 211. In FIG. 9, the sixth connection ends 284 are shown schematically. The sixth connection ends 284 may have a portion extending in parallel with the XY-plane, and may have a curved portion.

The external connection end 281 may protrude upward from the edge 283. The external connection end 281 of the present example functions as the second external connection terminal tm2 (M1).

Slits may or may not be provided in the plate portion 280 of the third intra-block connection portion 208. When providing the slits, slits that are similar to those provided on the plate portion 250 shown in FIG. 5 may be provided on the plate portion 280. In the example shown in FIG. 9, the current path between the external connection end 281 and the sixth connection end 284-2 becomes the shortest. The slit may be provided to traverse a straight line that links the external connection end 281 and the sixth connection end 284-2. In the third intra-block connection portion 208 of the present example, the distance from other connection portions in the X-axis direction is larger than 1 cm. The distance may be 2 cm or more. Therefore, the mutual electromagnetic induction between the third intra-block connection portion 208 and other connection portions is relatively small. Thus, oscillation and noise can be suppressed without providing slits to restrict the current path to pass a current in the opposite direction.

Figure 10:
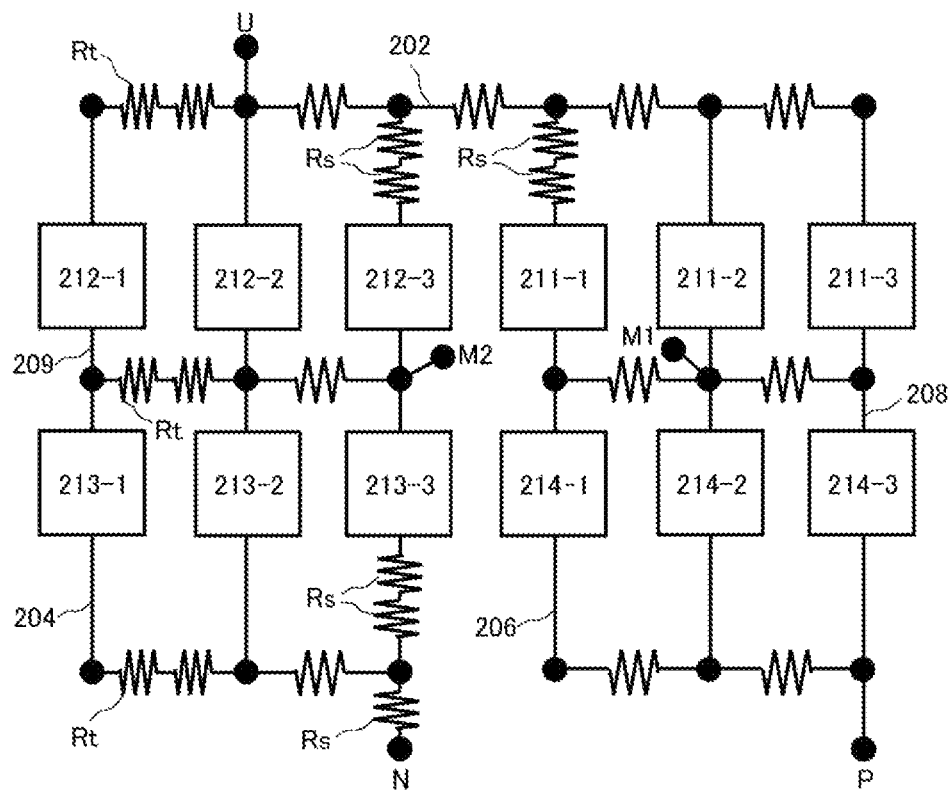
FIG. 10 schematically shows the resistance of the inter-block connection portion 202 and the intra-block connection portion among each of the circuit portions.

FIG. 10 schematically shows the resistance of the inter-block connection portion 202 and the intra-block connection portion among each of the circuit portions. In FIG. 10, the resistance increased by providing a slit in the inter-block connection portion 202 and the first intra-block connection portion 204 is shown as Rs. In addition, the resistance increased by providing a narrow region is shown as Rt.

As shown in FIG. 10, resistors Rs can be added to the first circuit portion 211-1 and the second circuit portion 212-3 by providing a slit on the inter-block connection portion 202. In this manner, the resistance values of the current paths between the plurality of first circuit portions 211 and the plurality of second circuit portions 212 can be equalized. In addition, resistors Rs can be added to the third circuit portion 213-3 by providing a slit on the first intra-block connection portion 204. In this manner, the resistance values of the current paths between the fourth external connection terminal tm4 (N) and the respective third circuit portions 213 can be equalized. In addition, by adding the resistors Rs, the current can be equalized between the circuit portions on the inner side and the circuit portions on the outer side, when the current flows in a U-shape or a C-shape. In addition, as shown in FIG. 5, adjusting the resistance becomes further easier by providing a slit in the second intra-block connection portion 206. In FIG. 10, the illustration of an additional resistors due to the slit being provided in the second intra-block connection portion 206 is omitted.

Third Example

Figure 11:
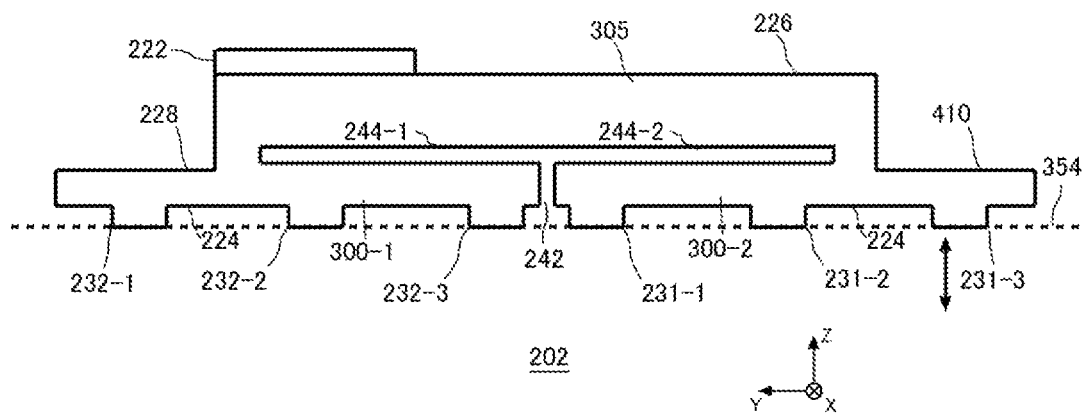
FIG. 11 shows another example of the inter-block connection portion 202.

FIG. 11 shows another example of the inter-block connection portion 202. The inter-block connection portion 202 of the present example differs from the inter-block connection portion 202 in the first example or the second example in that it has a narrow region 410. Other structures are the same as those in the first example or the second example.

The narrow region 410 is provided at an end on the side opposite to the narrow region 228, in the Y-axis direction. The narrow region 410 has a smaller width in the Z-axis direction than other regions. The width in the Z-axis direction and the length in the Y-axis direction of the narrow region 410 may be the same as those of the narrow region 228. By providing the narrow region 228, the arrangement balance of the current path in the inter-block connection portion 202 can be improved.

Fourth Example

Figure 12:
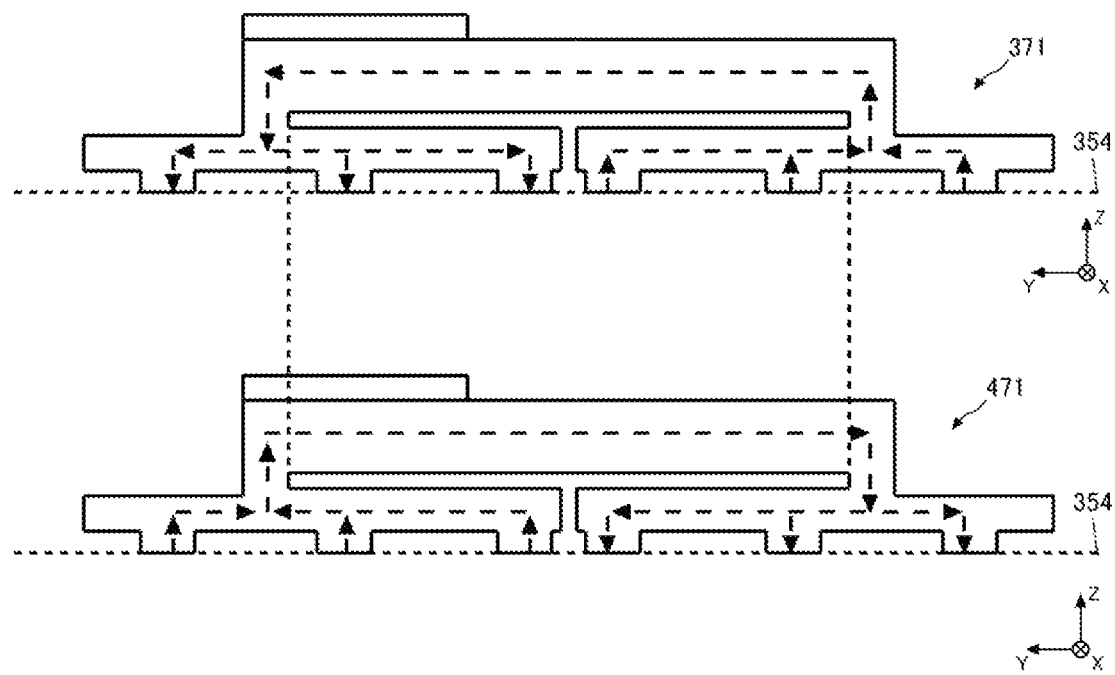
FIG. 12 shows an example of a connection portion 371 and a connection portion 471 provided opposing each other in the semiconductor device 100.

FIG. 12 shows an example of a connection portion 371 and a connection portion 471 provided opposing each other in the semiconductor device 100. In the first example to the third example, two connection portions were arranged to oppose each other for one connection portion. In the present example, for one connection portion 371, one connection portion 471 is arranged to oppose it. The lengths of the connection portion 371 and the connection portion 471 in the Y-axis direction may be the same. The semiconductor device of the present embodiment has a different circuit arrangement from those described for FIG. 1 to FIG. 4D.

In the present example, two opposing connection portions preferably have slits arranged in a similar manner as in the first to third examples. In this way, it becomes easier to pass a current in opposite directions in two opposing connection portions, and it is easier to suppress oscillation and noise.

In the example shown in FIG. 12, each of the connection portion 371 and the connection portion 471 have the same configuration as the inter-block connection portion 202 of any of the first to third examples. Note that, the configuration of the two connection portions is not limited thereto.

Fifth Example

Figure 13:
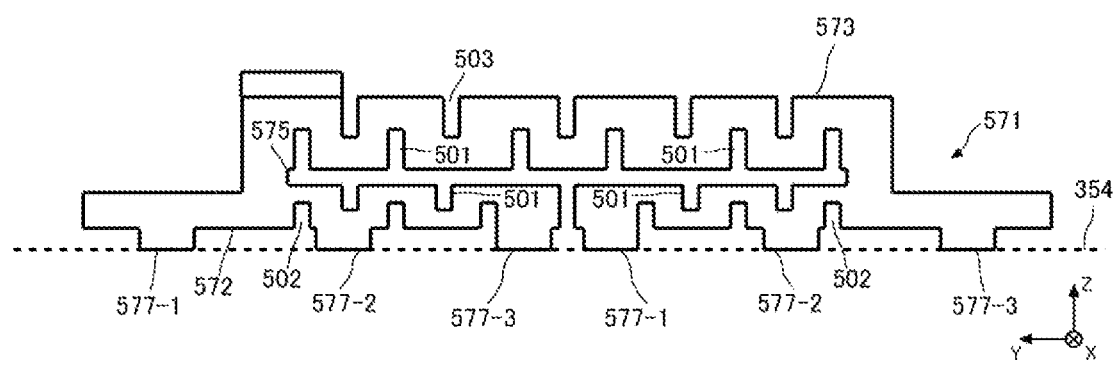
FIG. 13 shows an example of a connection portion 571.

FIG. 13 shows an example of a connection portion 571. The connection portion 571 can be used as any connection portion described in FIG. 1 to FIG. 12. The structures other than the slits of the connection portion 571 is the same as any connection portion described in FIG. 1 to FIG. 12.

The connection portion 571 has one or more branched slit 501, in addition to the slits in any connection portion described in FIG. 1 to FIG. 12. The branched slit 501 is a slit extending the Z-axis direction. The branched slit 501 may extend, in the Z-axis direction, from the slit 575 extending in the Y-axis direction. The slit 575 corresponds to any inner slit described in FIG. 1 to FIG. 12, or the first parallel slit 256, the third parallel slit 257, the second parallel slit 310, the fourth parallel slit 311. The connection portion 571 may have a branched slit 501 extending to the positive side of the Z-axis from the slit 575 and a branched slit 501 extending to the negative side.

In addition, the connection portion 571 may further have a branched slit 502 extending from the edge 572 on the circuit portion side in the Z-axis direction. The branched slit 501 and the branched slit 502 may be alternately arranged in the Y-axis direction between the slit 575 and the edge 572.

In addition, the connection portion 571 may further have a branched slit 503 extending from the edge 573 on the side opposite to the edge 572 in the Z-axis direction. The branched slit 501 and the branched slit 503 may be alternately arranged in the Y-axis direction between the slit 575 and the edge 573. Such configuration allows further adjustment of the length of the each current path.

Sixth Example

Figure 14:
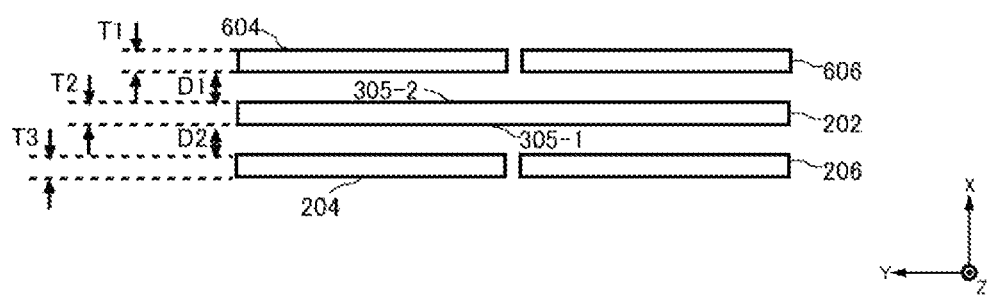
FIG. 14 shows another exemplary arrangement of a plurality of connection portions.

FIG. 14 shows another exemplary arrangement of a plurality of connection portions. In the present embodiment, three or more connection portions are arranged side by side in the X-axis direction. The semiconductor device of the present embodiment have a different circuit arrangement than the examples described in FIG. 1 to FIG. 4D. In the example shown in FIG. 14, a connection portion 604 and a connection portion 606 is provided, in addition to the inter-block connection portion 202, the first intra-block connection portion 204, the second intra-block connection portion 206 described in the first example or the second example. The connection portion 604 and the connection portion 606 is formed of a planar conductive material, and is connected to any circuit portion. In the present example, the first intra-block connection portion 204 is an example of the first connection portion, the inter-block connection portion 202 is an example of the second connection portion, and the connection portion 604 is an example of the fourth connection portion.

The inter-block connection portion 202 has a first main surface 305-1 and a second main surface 305-2. The first intra-block connection portion 204 and the second intra-block connection portion 206 are arranged to face the first main surface 305-1. The connection portion 604 and the connection portion 606 are arranged to face the second main surface 305-2. The first intra-block connection portion 204 and the connection portion 604 are arranged with the inter-block connection portion 202 sandwiched therebetween. The second intra-block connection portion 206 and the connection portion 606 are arranged with the inter-block connection portion 202 sandwiched therebetween. The connection portion 604 and the connection portion 606 may be arranged side by side along the Y-axis.

The thickness in the X-axis direction of the first intra-block connection portion 204 and the second intra-block connection portion 206 is T3, the thickness of the inter-block connection portion 202 is T2, and the thickness of the connection portion 604 and the connection portion 606 is T1. In addition, the distance in the X-axis direction between the first and second intra-block connection portions 204 and 206 and the inter-block connection portion 202 is D2, and the distance in the X-axis direction between the connection portions 604 and 606 and the inter-block connection portion 202 is D1. The distance D1 and the distance D2 is 1 cm or less, for example. The distance D1 and the distance D2 may be 0.5 mm or less.

As described in the first example or the second example, the direction of a current of the current path in the first intra-block connection portion 204 and the second intra-block connection portion 206, and the direction of a current of the opposing current path in the inter-block connection portion 202 are the opposite. Similarly, the direction of a current of the current path in the connection portion 604 and the connection portion 606 and the direction of a current of the opposing current path in the inter-block connection portion 202 are preferably the opposite. That is, in the connection portions arranged side by side in the X-axis direction, the directions of a current in the opposing current paths may be alternately reversed. In addition, in two connection portions sandwiching the inter-block connection portion 202 (the first intra-block connection portion 204 and the connection portion 604, for example), the directions of a current in the opposing current paths are the same. In this way, the mutual electromagnetic induction between each connection portion can be suppressed.

Figure 15:
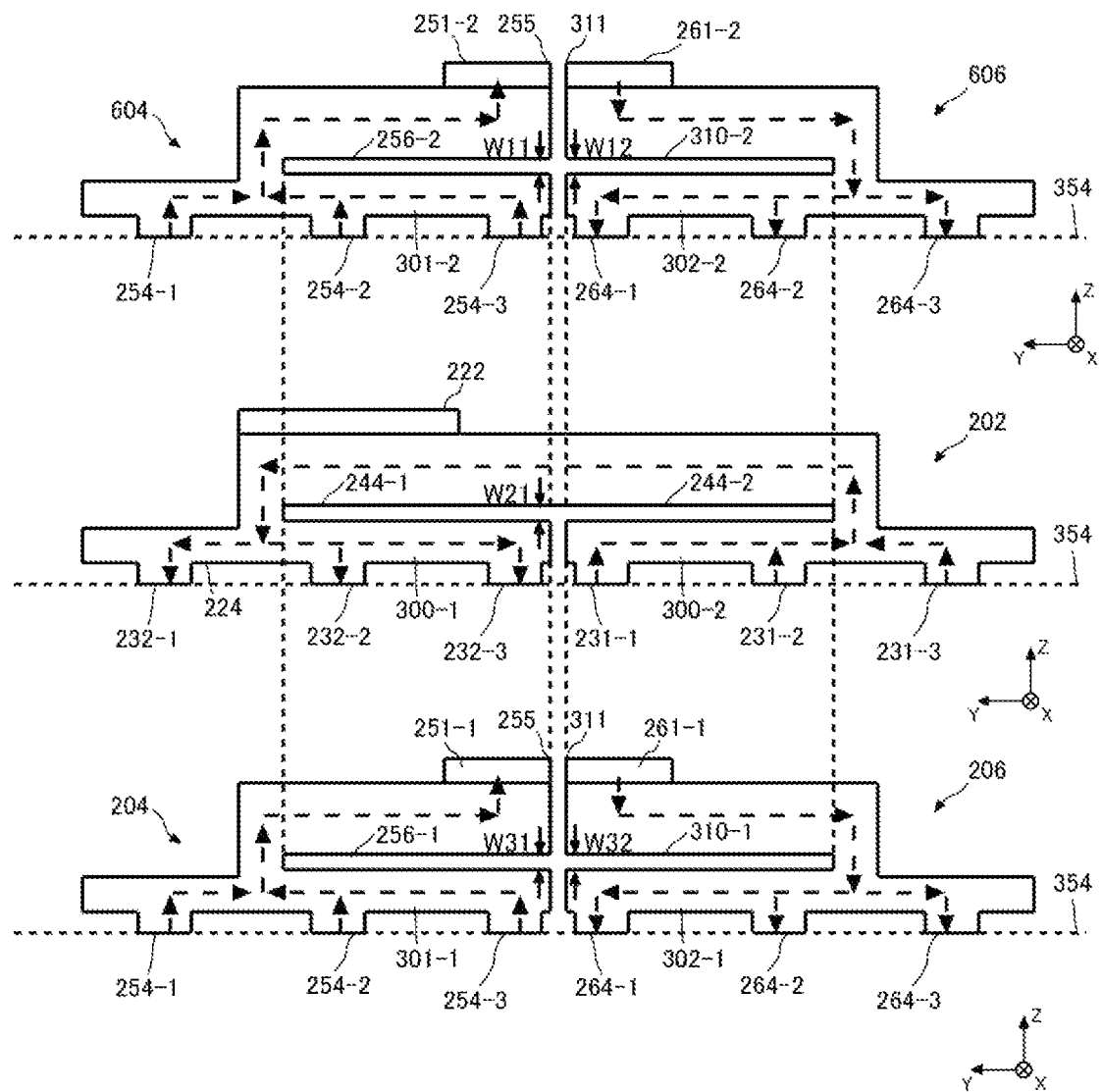
FIG. 15 shows an exemplary arrangement of the slits in each connection portion shown in FIG. 14.

FIG. 15 shows an exemplary arrangement of the slits in each connection portion shown in FIG. 14. The inter-block connection portion 202, the first intra-block connection portion 204, and the second intra-block connection portion 206 may have the same structure as those in the first example or the second example. The connection portion 604 may have the same slit and terminal arrangements as the first intra-block connection portion 204. The connection portion 606 may have the same slit and terminal arrangements as the second intra-block connection portion 206.

In the present example, a current flows from the external connection end 261-1 of the second intra-block connection portion 206 to the fourth connection end 264 of the second intra-block connection portion 206. Similarly, a current flows from the external connection end 261-2 of the connection portion 606 to the fourth connection end 264 of the connection portion 606. The external connection end 261-1 and the external connection end 261-2 may be connected to an external power supply, for example. A current that flowed through the fourth connection end 264 of the second intra-block connection portion 206 and the current that flowed through the fourth connection end 264 of the connection portion 606 both flow to the first connection end 231 of the inter-block connection portion 202. In the inter-block connection portion 202, a current flows from the first connection end 231 to the second connection end 232. The current that flowed through the second connection end 232 branches and flows to the third connection end 254 of the first intra-block connection portion 204 and the third connection end 254 of the connection portion 604. In the first intra-block connection portion 204, a current flows from the third connection end 254 to the external connection terminal 251-1. In the connection portion 604, a current flows from the third connection end 254 to the external connection terminal 251-2. The external connection terminal 251-1 and the external connection terminal 251-2 may be connected to the external power supply.

According to the configuration shown in FIG. 15, the direction of a current of the opposing current paths can be reversed. For example, the direction of a current in the current path 300-1 of the inter-block connection portion 202 is the opposite of both the direction of a current in the current path 301-1 of the first intra-block connection portion 204 and the direction of a current in the current path 302-1 of the connection portion 604. In addition, the direction of a current in the current path 300-2 of the inter-block connection portion 202 is the opposite of both the direction of a current in the current path 302-1 of the second intra-block connection portion 206 and the direction of a current in the current path 302-2 of the connection portion 606.

The width W in the Z-axis direction of a slit extending in the Y-axis direction in each connection portion may be the same or may be different. In the present example, the width of the first inner slit 244-1 and the second inner slit 244-2 is W21. In addition, the width of the first parallel slit 256-1 in the first intra-block connection portion 204 is W31, and the width of the first parallel slit 256-2 in the connection portion 604 is W11. In addition, the width of the second parallel slit 310-1 in the second intra-block connection portion 206 is W32, and the width of the second parallel slit 310-2 in the connection portion 606 is W12. The widths W11, W21, W31, W12, W32 may each be the same.

In another example, the width W of the slits may be different according to the amount of current (A) flowing through each connection portion. In the present example, as described above, a current flowing through the first intra-block connection portion 204 and the connection portion 604 flows to the inter-block connection portion 202. In addition, a current flowing through the second intra-block connection portion 206 and the connection portion 606 flows to the inter-block connection portion 202. Therefore, the current flowing through the inter-block connection portion 202 is larger than the current flowing through other connection portions.

The width W21 of the first inner slit 244-1 and the second inner slit 244-2 in the inter-block connection portion 202 may be larger than any of the widths W11, W31, W12, W32 of the slits in other connection portions. In this way, the width in the Z-axis direction of the current path 300 in the inter-block connection portion 202 can be reduced, and it becomes easier to suppress the mutual electromagnetic induction among the connection portions.

In addition, in other examples, the width W of the slits in each connection portion may be adjusted according to the thickness T of each connection portion. The larger the thickness T of the connection portions, the larger the width W of the slits may be. In this way, variation in the cross sectional areas of the current paths can be suppressed and variation in resistance values can be suppressed among each connection portion. Therefore, the size of currents flowing in opposite directions can be adjusted and mutual electromagnetic induction can be suppressed among opposing current paths.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

EXPLANATION OF REFERENCES 36 conductivity pattern; 50 insulating substrate; 90 connection member; 100 semiconductor device; 110 casing portion; 112 notch portion; 114 terminal arrangement surface; 116 convex portion; 120 base portion; 201 straight line; 202 inter-block connection portion; 204 first intra-block connection portion; 206 second intra-block connection portion; 208 third intra-block connection portion; 209 fourth intra-block connection portion; 210 connection region; 211 first circuit portion; 212 second circuit portion; 213 third circuit portion; 214 fourth circuit portion; 220 plate portion; 222 external connection end; 224 edge; 226 edge; 228 narrow region; 230 current path; 231 first connection end; 232 second connection end; 242 edge slit; 244 inner slit; 250 plate portion; 251 external connection end; 252 edge; 253 edge; 254 third connection end; 255 edge; 256 first parallel slit; 257 third parallel slit; 259 slit; 260 plate portion; 261 external connection end; 262 edge; 263 edge; 264 fourth connection end; 270 plate portion; 271 external connection end; 272 edge; 273 edge; 274 fifth connection end; 280 plate portion; 281 external connection end; 282 edge; 283 edge; 284 sixth connection end; 300, 301, 302 current path; 303, 305, 307 main surface; 309 fourth parallel slit; 310 second parallel slit; 311 edge; 317 edge slit; 351, 352 overlapping region; 354 location; 371 connection portion; 410 narrow region; 471 connection portion; 501, 502, 503 branched slit; 571 connection portion; 572, 573 edge; 575 slit; 604, 606 connection portion

What is claimed is:

1. A semiconductor device comprising:
 a plurality of circuit portions; and
 a first connection portion and a second connection portion that are formed of planar conductive materials and connected to any of the plurality of circuit portions, wherein
 the first connection portion and the second connection portion are arranged with respective main surfaces facing each other,
 the first connection portion and the second connection portion each comprising:
  a circuit connection end connected to the circuit portions; and
  a path restriction portion for restricting a current path in the main surface,
 directions of currents flowing through the current paths between the path restriction portions and the circuit connection ends are different in the first connection portion and the second connection portion,
 the first connection portion and the second connection portion include an overlapping region that overlaps in a direction orthogonal to the main surfaces, and
 the path restriction portions of the first connection portion and the second connection portion include one or more first slits extending in a first direction.

2. The semiconductor device according to claim 1, wherein
 the directions of the currents flowing through the current paths between the path restriction portions and the circuit connection ends are opposite in the first connection portion and the second connection portion.

3. The semiconductor device according to claim 1, wherein
for each of the first connection portion and the second connection portion, the circuit connection ends and the path restriction portions are arranged such that at least a portion of the current circulates around the path restriction portions, and
the directions of the currents circulating around the path restriction portions are opposite in the first connection portion and the second connection portion.

4. The semiconductor device according to claim 1, wherein
the first connection portion and the second connection portion are arranged with respective main surfaces arranged in parallel.

5. The semiconductor device according claim 4, wherein
in the overlapping region, a number of the first slits provided in the first connection portion and a number of the first slits provided in the second connection portion are the same.

6. The semiconductor device according to claim 5, wherein
the path restriction portions of the first connection portion and the second connection portion include one or more second slits extending in a second direction that is different from the first direction, and
in the overlapping region, the number of the second slits provided in the first connection portion and the number of the second slits provided in the second connection portion are the same.

7. The semiconductor device according to claim 5, wherein
an upper end of the first connection portion and an upper end of the second connection portion are arranged at a same height, and
in the overlapping region, the one or more first slits provided in the first connection portion and the one or more first slits provided in the second connection portion are arranged at a same height.

8. The semiconductor device according to claim 5, wherein
an upper end of the first connection portion is arranged at a position higher than an upper end of the second connection portion, and
in the overlapping region, the one or more first slits provided in the first connection portion are arranged at a position higher than the one or more first slits provided in the second connection portion.

9. The semiconductor device according to claim 5, wherein,
a width of the one or more first slits in the first connection portion and a width of the one or more first slits in the second connection portion are different.

10. The semiconductor device according to claim 9, wherein
a thickness of the first connection portion is larger than a thickness of the second connection portion, and
the width of the one or more first slits in the first connection portion is larger than the width of the one or more first slits in the second connection portion.

11. The semiconductor device according to claim 9, wherein
a current flowing through the first connection portion is larger than a current flowing through the second connection portion, and the width of the one or more first slits in the first connection portion is larger than the width of the one or more first slits in the second connection portion.

12. The semiconductor device according to claim 1, further comprising a third connection portion formed of a planar conductive material and connected to any of the plurality of circuit portions, wherein
the first connection portion is arranged to face a first main surface of the second connection portion,
the third connection portion is arranged to face the first main surface of the second connection portion,
the third connection portion includes the circuit connection end and the path restriction portion, and
the directions of the currents flowing through the current paths between the path restriction portions and the circuit connection ends are different in the third connection portion and the second connection portion.

13. The semiconductor device according to claim 1, further comprising a fourth connection portion formed of a planar conductive material and connected to any of the plurality of circuit portions, wherein
the first connection portion is arranged to face a first main surface of the second connection portion,
the fourth connection portion is arranged to face a second main surface of the second connection portion,
the fourth connection portion includes the circuit connection end and the path restriction portion, and
the directions of the currents flowing through the current paths between the path restriction portions and the circuit connection ends are different in the fourth connection portion and the second connection portion.

14. A semiconductor device comprising: a plurality of circuit portions; a first connection portion and a second connection portion that are formed of planar conductive materials and connected to any of the plurality of circuit portions; and a third connection portion formed of a planar conductive material and connected to any of the plurality of circuit portions, wherein the first connection portion and the second connection portion are arranged with respective main surfaces facing each other, the first connection portion and the second connection portion each comprising: a circuit connection end connected to the circuit portions; and a path restriction portion for restricting a current path in the main surface, directions of currents flowing through the current paths between the path restriction portions and the circuit connection ends are different in the first connection portion and the second connection portion, the first connection portion is arranged to face a first main surface of the second connection portion, the third connection portion is arranged to face the first main surface of the second connection portion, the third connection portion includes the circuit connection end and the path restriction portion, the directions of the currents flowing through the current paths between the path restriction portions and the circuit connection ends are different in the third connection portion and the second connection portion, wherein the second connection portion comprises: an edge slit provided from a circuit side edge on which the circuit connection end is provided towards an interior of the second connection portion; a first inner slit connected to the edge slit and extending along the circuit side edge; and a second inner slit connected to the edge slit, and extending along the circuit side edge and towards an opposite side of the first inner slit, wherein the first connection portion and the third connection portion are arranged side by side in a direction parallel to the main surface of the second connection portion, the first connection portion has a first parallel slit extending from an edge facing the third connection portion in a direction parallel to the first inner slit, and the third connection portion has a second parallel slit extending from an edge facing the first connection portion in a direction parallel to the second inner slit.

15. A semiconductor device comprising: a plurality of circuit portions; a first connection portion and a second connection portion that are formed of planar conductive materials and connected to any of the plurality of circuit portions; and a fourth connection portion formed of a planar conductive material and connected to any of the plurality of circuit portions, wherein the first connection portion and the second connection portion are arranged with respective main surfaces facing each other, the first connection portion and the second connection portion each comprising: a circuit connection end connected to the circuit portions; and a path restriction portion for restricting a current path in the main surface, directions of currents flowing through the current paths between the path restriction portions and the circuit connection ends are different in the first connection portion and the second connection portion, the first connection portion is arranged to face a first main surface of the second connection portion, the fourth connection portion is arranged to face the first main surface of the second connection portion, the fourth connection portion includes the circuit connection end and the path restriction portion, the directions of the currents flowing through the current paths between the path restriction portions and the circuit connection ends are different in the fourth connection portion and the second connection portion, the path restriction portions of the first connection portion, the second connection portion, and the fourth connection portion include one or more first slits extending in a first direction, a current flowing through the first connection portion and a current flowing through the fourth connection portion flow to the second connection portion, and a width of the one or more first slits in the second connection portion is larger than a width of the one or more first slits in the first connection portion and a width of the one or more first slits in the fourth connection portion.

* * * * *